(12) United States Patent
Asano et al.

(10) Patent No.: US 9,513,548 B2
(45) Date of Patent: *Dec. 6, 2016

(54) RADIATION-SENSITIVE RESIN COMPOSITION, METHOD FOR FORMING RESIST PATTERN, POLYMER AND POLYMERIZABLE COMPOUND

(71) Applicant: JSR CORPORATION, Tokyo (JP)

(72) Inventors: Yuusuke Asano, Tokyo (JP); Mitsuo Satou, Tokyo (JP); Hiromitsu Nakashima, Tokyo (JP); Kazuki Kasahara, Tokyo (JP); Yoshifumi Oizumi, Tokyo (JP); Masafumi Hori, Tokyo (JP); Takanori Kawakami, Tokyo (JP); Yasuhiko Matsuda, Tokyo (JP); Kazuo Nakahara, Tokyo (JP)

(73) Assignee: JSR CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/242,957

(22) Filed: Apr. 2, 2014

(65) Prior Publication Data

US 2014/0212813 A1 Jul. 31, 2014

Related U.S. Application Data

(63) Continuation of application No. 13/420,618, filed on Mar. 15, 2012, now Pat. No. 8,728,706, which is a continuation of application No. PCT/JP2010/066216, filed on Sep. 17, 2010.

(30) Foreign Application Priority Data

| Sep. 18, 2009 | (JP) | 2009-218175 |
| Oct. 9, 2009 | (JP) | 2009-235763 |
| Mar. 31, 2010 | (JP) | 2010-080744 |

(51) Int. Cl.

| G03F 7/039 | (2006.01) |
| G03F 7/30 | (2006.01) |
| C08F 20/22 | (2006.01) |
| G03F 7/004 | (2006.01) |
| G03F 7/038 | (2006.01) |
| G03F 7/20 | (2006.01) |

(52) U.S. Cl.
CPC ............ *G03F 7/0392* (2013.01); *C08F 20/22* (2013.01); *G03F 7/0046* (2013.01); *G03F 7/038* (2013.01); *G03F 7/0388* (2013.01); *G03F 7/30* (2013.01); *G03F 7/2041* (2013.01)

(58) Field of Classification Search
None
See application file for complete search history.

(56) References Cited

U.S. PATENT DOCUMENTS

| 4,578,504 | A | 3/1986 | Hammar |
| 4,822,718 | A | 4/1989 | Latham et al. |
| 4,876,165 | A | 10/1989 | Brewer et al. |
| 4,910,122 | A | 3/1990 | Arnold et al. |
| 5,674,648 | A | 10/1997 | Brewer et al. |
| 5,744,537 | A | 4/1998 | Brunsvold et al. |
| 6,057,080 | A | 5/2000 | Brunsvold et al. |
| 8,609,318 | B2 * | 12/2013 | Nakahara ............. G03F 7/0046 430/270.1 |
| 8,728,706 | B2 * | 5/2014 | Asano .................... C08F 20/22 430/270.1 |
| 2005/0277059 | A1 | 12/2005 | Kanda |
| 2008/0311507 | A1 | 12/2008 | Isono et al. |
| 2009/0011199 | A1 | 1/2009 | Isono et al. |
| 2009/0047602 | A1 | 2/2009 | Furuya et al. |
| 2009/0142699 | A1 | 6/2009 | Furuya et al. |
| 2009/0197204 | A1 | 8/2009 | Shiono et al. |
| 2009/0202945 | A1 | 8/2009 | Nakagawa et al. |
| 2009/0226843 | A1 | 9/2009 | Hatakeyama et al. |
| 2009/0311627 | A1 | 12/2009 | Kurosawa et al. |
| 2009/0317743 | A1 | 12/2009 | Shiono et al. |
| 2010/0233626 | A1 | 9/2010 | Shimizu et al. |
| 2010/0255420 | A1 | 10/2010 | Sakakibara et al. |
| 2010/0310985 | A1 | 12/2010 | Mori et al. |
| 2011/0098500 | A1 | 4/2011 | Isono et al. |

(Continued)

FOREIGN PATENT DOCUMENTS

| EP | 2088466 | 8/2009 |
| EP | 2325694 | 5/2011 |

(Continued)

OTHER PUBLICATIONS

Office Action issued Jul. 1, 2014, in Japanese Patent Application No. 2010-208641 with English translation.

(Continued)

*Primary Examiner* — Cynthia Hamilton
(74) *Attorney, Agent, or Firm* — Oblon, McClelland, Maier & Neustadt, L.L.P.

(57) ABSTRACT

A radiation-sensitive resin composition includes a first polymer including an acid-labile group, an acid generator to generate an acid upon exposure to radiation, and a second polymer including a fluorine atom and a functional group shown by a general formula (x). The second polymer has a fluorine atom content higher than a fluorine atom content of the first polymer. $R^1$ represents an alkali-labile group. A represents an oxygen atom, —NR'—, —CO—O—#, or —SO$_2$—O—##, wherein the oxygen atom represented by A is not an oxygen atom bonded directly to an aromatic ring, a carbonyl group, or a sulfoxyl group, R' represents a hydrogen atom or an alkali-labile group, and "#" and "##" each indicate a bonding hand bonded to $R^1$.

—A—$R^1$      (x)

12 Claims, No Drawings

(56) References Cited

U.S. PATENT DOCUMENTS

| | | | |
|---|---|---|---|
| 2012/0034560 A1 | 2/2012 | Nakahara et al. | |
| 2012/0226070 A1 | 9/2012 | Isono et al. | |
| 2013/0022912 A1 | 1/2013 | Sato et al. | |

FOREIGN PATENT DOCUMENTS

| | | | |
|---|---|---|---|
| JP | 6-12452 B2 | | 5/1984 |
| JP | 60-6711 A | | 1/1985 |
| JP | 63-256492 A | | 10/1988 |
| JP | 63-317388 A | | 12/1988 |
| JP | 2-125265 A | | 5/1990 |
| JP | 5-188598 | | 7/1993 |
| JP | 2004-083900 A | | 3/2004 |
| JP | 2005-352384 | | 12/2005 |
| JP | 2008-268743 | | 11/2008 |
| JP | 2009-019199 | | 1/2009 |
| JP | 2009-29802 A | | 2/2009 |
| JP | 2009-69814 | | 4/2009 |
| JP | 2009-74085 A | | 4/2009 |
| JP | 2009-92880 | | 4/2009 |
| JP | 2009-98687 | | 5/2009 |
| JP | 2009-132843 | | 6/2009 |
| JP | 2009-134088 | | 6/2009 |
| JP | 2009-139909 | | 6/2009 |
| JP | 2009-175363 | | 8/2009 |
| JP | 2009-197184 | | 9/2009 |
| JP | 2009-235118 | | 10/2009 |
| JP | 2009-300950 | | 12/2009 |
| JP | 2010-2870 | | 1/2010 |
| JP | 2010-20284 | | 1/2010 |
| JP | 2010-32994 | | 2/2010 |
| JP | 2010-197413 | | 9/2010 |
| JP | 2010-204187 A | | 9/2010 |
| JP | 2010-210953 | | 9/2010 |
| JP | 2010-275498 A | | 12/2010 |
| JP | 2010-277043 A | | 12/2010 |
| JP | 2011-13569 A | | 1/2011 |
| JP | 2011-53567 A | | 3/2011 |
| JP | 2011-53568 A | | 3/2011 |
| KR | 10-2009-0039492 A | | 4/2009 |
| WO | WO 2007-116664 | | 10/2007 |
| WO | WO 2008/053904 A1 | | 5/2008 |
| WO | WO 2008/053906 A1 | | 5/2008 |
| WO | WO 2009/057484 | | 5/2009 |
| WO | WO 2010/029982 | | 3/2010 |
| WO | WO 2011/125684 | | 10/2011 |

OTHER PUBLICATIONS

Taiwanese Office Action issued Jul. 30, 2014, in Taiwan Patent Application No. 099131644 (with English translation).
Tadatomi Nishikubo et al., "Convenient Syntheses of Cyclic Carbonates by New Reaction of Oxiranes With β-Butyrolactone", Tetrahedron Letters, 1986, pp. 3741-3744, vol. 27, No. 32.
Vincenzo Calo wt al., "Cyclic Carbonate Formation from Carbon Dioxide and Oxiranes in Tetrabutylammonium Halides as Solvents and Catalysts", Organic Letters, 2002, pp. 2561-2563, vol. 4, No. 15.
International Search Report for corresponding International Application No. PCT/JP2010/066216, Oct. 26, 2010.
Written opinion for corresponding International Application No. PCT/JP2010/066216, Oct. 26, 2010.
Chinese Office Action for corresponding CN Application No. 201080041184.6, Jan. 14, 2013.
Extended European Search Report for corresponding EP Application No. 10817289.1-1555, Jun. 4, 2013.
Chinese Office Action for corresponding CN Application No. 201080041184.6, Oct. 24, 2013.
Japanese Office Action for corresponding JP Application No. 2010-208700, Dec. 24, 2013.
Japanese Office Action for corresponding JP Application No. 2010-208639, Dec. 24, 2013.
Partial European Search Report issued Sep. 30, 2014 in Patent Application No. 14157031.7.
Extended European Search Report issued Mar. 18, 2015 in Patent Application No. 14157031.7.
"Polyhydroxyethylmethacrylate" Wikipedia, the free encyclopedia, Retrieved from the Internet: URL:http://en.wikipedia.org/wiki/Polyhydroxyethylmethacrylate, XP055174015, 2015, 2 pages.
Office Action issued Mar. 24, 2015 in Japanese Patent Application No. 2014-170995 (with English language translation).
Office Action issued Nov. 10, 2015, in Japanese Patent Application No. 2014-170995 (w/ English translation).
Office Action issued Aug. 19, 2014 in Japanese Patent Application No. 2010-208639 (with English translation).
Office Action issued Aug. 19, 2014 in Japanese Patent Application No. 2010-208700 (with English translation).
Daniel P. Sanders, "Advances in Patterning Materials for 193 nm Immersion Lithography", Chem. Rev., 2010, 110, pp. 321-360.
Office Action issued Sep. 19, 2016, in Korean Patent Application No. 10-2012-7004184 (w/ English Translation).

* cited by examiner

RADIATION-SENSITIVE RESIN COMPOSITION, METHOD FOR FORMING RESIST PATTERN, POLYMER AND POLYMERIZABLE COMPOUND

CROSS-REFERENCE TO RELATED APPLICATIONS

The present application is a continuation application of the U.S. patent application Ser. No. 13/420,618 filed Mar. 15, 2012, which in turn is a continuation application of International Application No. PCT/JP2010/066216, filed Sep. 17, 2010, which claims priority to Japanese Patent Application No. 2009-218175, filed Sep. 18, 2009, to Japanese Patent Application No. 2009-235763, filed Oct. 9, 2009 and to Japanese Patent Application No. 2010-080744, filed Mar. 31, 2010. The contents of these applications are incorporated herein by reference in their entirety.

BACKGROUND OF THE INVENTION

Field of the Invention

The invention relates to a radiation-sensitive resin composition, a method for forming a resist pattern, a polymer, and a polymerizable compound.

Discussion of the Background

In the field of micro fabrication such as production of integrated circuit devices, a fine resist pattern may be formed by forming a resist film on a substrate using a resin composition including an acid-labile group-containing polymer, exposing the resist film by applying short-wavelength radiation (e.g., excimer laser light) to the resist film via a mask pattern, and removing the exposed area by alkali development. This process may utilize a chemically-amplified resist that includes a radiation-sensitive acid generator that generates an acid upon irradiation, and exhibits improved sensitivity due to the acid.

Liquid immersion lithography has become widespread as a method that can form a finer resist pattern (line width: about 45 nm, for example). According to this process, exposure is conducted in a state in which the exposure optical path (i.e., the space between the lens and the resist film) is filled with an immersion liquid (e.g., purified water or fluorine-containing inert liquid) that has a refractive index (n) higher than that of air and inert gas. Therefore, the depth of focus decreases to only a small extent, and high resolution can be obtained even when increasing the numerical aperture (NA) of the lens.

A resin composition that contains a fluorine-containing polymer that exhibits high hydrophobicity has been proposed as resin composition used for liquid immersion lithography aimed at preventing elution of the acid generator or the like from the resist film into the immersion liquid, and providing the resist film with improved water repellency (see WO2007/116664A).

A fluorine-containing polymer that exhibits hydrophobicity during liquid immersion lithography, and exhibits hydrophilicity during alkali development, specifically a fluorine-containing polymer in which a fluoroacyl group that exhibits high hydrophobicity is introduced into a phenolic hydroxyl group) has also been proposed aimed at suppressing development defects or the like in the unexposed area due to hydrophobization of the resist film (see Japanese Patent Application Publication (KOKAI) No. 2009-132843 and Japanese Patent Application Publication (KOKAI) No. 2009-139909).

The fluorine-containing polymer disclosed in Japanese Patent Application Publication No. 2009-132843 or Japanese Patent Application Publication No. 2009-139909 exhibits hydrophobicity during liquid immersion lithography due to the fluoroacyl group, and exhibits hydrophilicity during alkali development due to the phenolic hydroxyl group via elimination of the fluoroacyl group. Therefore, occurrence of development defects in the unexposed area is expected to be suppressed.

The fluorine-containing polymer disclosed in Japanese Patent Application Publication No. 2009-132843 or Japanese Patent Application Publication No. 2009-139909 may suppress occurrence of development defects in the unexposed area to some extent.

SUMMARY OF THE INVENTION

According to one aspect of the present invention, a radiation-sensitive resin composition includes a first polymer including an acid-labile group, an acid generator to generate an acid upon exposure to radiation, and a second polymer including a fluorine atom and a functional group shown by a general formula (x). The second polymer has a fluorine atom content higher than a fluorine atom content of the first polymer.

$R^1$ represents an alkali-labile group. A represents an oxygen atom, $-NR'-$, $-CO-O-^{\#}$ or $-SO_2-O-^{\#\#}$, wherein the oxygen atom represented by A is not an oxygen atom bonded directly to an aromatic ring, a carbonyl group, or a sulfoxyl group, R' represents a hydrogen atom or an alkali-labile group, and "#" and "##" each indicate a bonding hand bonded to $R^1$.

According to another aspect of the present invention, a method for forming a resist pattern includes forming a resist film on a substrate using the radiation-sensitive resin composition. The resist film is exposed by applying radiation to the resist film via a mask pattern. The exposed resist film is developed to form a resist pattern.

According to further aspect of the present invention, a polymer includes a repeating unit shown by a general formula (c0).

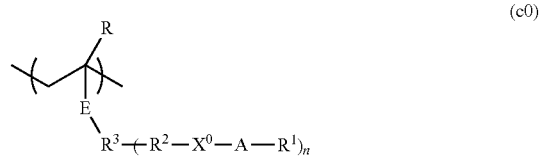

n is an integer from 1 to 3. $R^1$ represents an alkali-labile group, wherein each $R^1$ is either a same as or different from each other when n is 2 or 3. A represents an oxygen atom, $-NR'-$, $-CO-O-^{\#}$, or $-SO_2-O-^{\#\#}$, wherein R' represents a hydrogen atom or an alkali-labile group and "#" and "##" each indicate a bonding hand bonded to $R^1$ and wherein each A is either a same as or different from each other when n is 2 or 3. $R^2$ represents a single bond, a divalent chain hydrocarbon group having 1 to 10 carbon atoms, or a divalent cyclic hydrocarbon group having 4 to 20 carbon atoms, wherein each $R^2$ is either a same as or different from each other when n is 2 or 3. $X^0$ represents a single bond or a divalent chain hydrocarbon group having 1 to 20 carbon atoms in which some or all of hydrogen atoms are substituted with a fluorine atom, wherein each $X^0$ is either a same as or different from each other when n is 2 or 3. $R^3$ represents an (n+1)-valent hydrocarbon group having 1 to 20 carbon atoms, wherein, optionally, an oxygen atom, a sulfur atom, an imino group, a carbonyl group, —CO—O—, or —CO—NH— is bonded to an end of $R^3$ which is bonded to $R^2$. E represents an oxygen atom, —CO—O—$^{\#\#\#}$, or —CO—NH—$^{\#\#\#\#}$, wherein "###" and "####" each indicate a bonding hand bonded to $R^3$. R represents a hydrogen atom, a methyl group, or a trifluoromethyl group.

According to further aspect of the present invention, a compound is shown by a general formula (Mc2-2). The compound is other than a compound shown by a formula (4) or a formula (5).

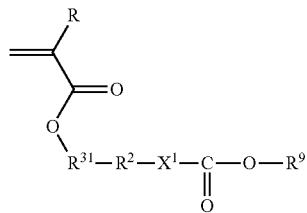

(Mc2-2)

$R^9$ represents a group shown by a general formula (1), a general formula (2) or a general formula (3). $X^1$ represents a single bond, a difluoromethylene group, or a linear or branched divalent perfluorohydrocarbon group having 2 to 20 carbon atoms. $R^2$ represents a single bond, a methylene group, a linear or branched divalent hydrocarbon group having 2 to 10 carbon atoms, or a divalent cyclic hydrocarbon group having 4 to 20 carbon atoms. $R^{31}$ represents a methylene group, a linear or branched divalent hydrocarbon group having 2 to 10 carbon atoms, or a divalent cyclic hydrocarbon group having 4 to 20 carbon atoms, wherein, optionally, an oxygen atom, a sulfur atom, an imino group, a carbonyl group, —CO—O—, or —CO—NH— is bonded to an end of $R^{31}$ which is bonded to $R^2$. R represents a hydrogen atom, a methyl group, or a trifluoromethyl group.

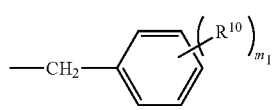

(1)

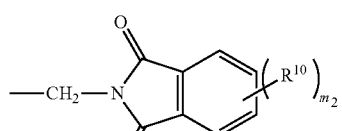

(2)

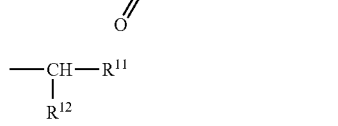

(3)

$R^{10}$ represents a halogen atom, an alkyl group having 1 to 10 carbon atoms, an alkoxy group having 1 to 10 carbon atoms, an acyl group having 1 to 10 carbon atoms, or an acyloxy group having 1 to 10 carbon atoms, wherein each $R^{10}$ is either a same as or different from each other when a plurality of $R^{10}$ are present. $m_1$ is an integer from 0 to 5. $m_2$ is an integer from 0 to 4. Each of $R^{11}$ and $R^{12}$ independently represents a hydrogen atom or an alkyl group having 1 to 10 carbon atoms, or $R^{11}$ and $R^{12}$ bond to each other to form an alicyclic structure having 4 to 20 carbon atoms together with the carbon atom bonded to $R^{11}$ and $R^{12}$.

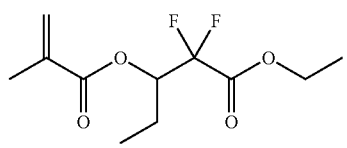

(4)

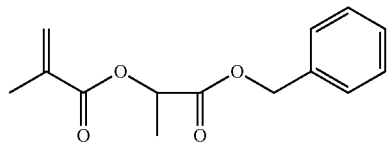

(5)

DESCRIPTION OF THE EMBODIMENTS

The embodiment of the present invention provides the following radiation-sensitive resin composition, method for forming a resist pattern, polymer, and polymerizable compound.

[1] A radiation-sensitive resin composition comprising (A) a polymer that includes an acid-labile group, (B) an acid generator that generates an acid upon exposure to radiation, and (C) a polymer that includes a fluorine atom and a functional group shown by a general formula (x), the polymer (C) having a fluorine atom content higher than that of the polymer (A),

(x)

wherein $R^1$ represents an alkali-labile group, and A represents an oxygen atom (excluding an oxygen atom that is bonded directly to an aromatic ring, a carbonyl group, or a sulfoxyl group), —NR'— (wherein R' represents a hydrogen atom or an alkali-labile group), —CO—O—$^{\#}$, or —SO$_2$—O—$^{\#\#}$ (wherein "#" and "##" indicates a bonding hand bonded to $R^1$).

[2] The radiation-sensitive resin composition according to [1], wherein the polymer (C) includes a repeating unit shown by a general formula (c0),

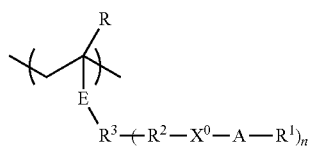

(c0)

wherein $R^1$ and A are the same as defined for the general formula (x), $R^2$ represents a single bond, a divalent chain-like hydrocarbon group having 1 to 10 carbon atoms, or a divalent cyclic hydrocarbon group having 4 to 20 carbon atoms, $X^0$ represents a single bond or a divalent chain-like hydrocarbon group having 1 to 20 carbon atoms in which some or all of hydrogen atoms are substituted with a fluorine atom, $R^3$ represents an (n+1)-valent hydrocarbon group having 1 to 20 carbon atoms, provided that an oxygen atom, a sulfur atom, an imino group, a carbonyl group, —CO—O—, or —CO—NH— may be bonded to an end of $R^3$ that is bonded to $R^2$, E represents an oxygen atom, —CO—O—###, or —CO—NH—#### (wherein "###" and "####" indicates a bonding hand bonded to $R^3$), R represents a hydrogen atom, a methyl group, or a trifluoromethyl group, and n is an integer from 1 to 3, provided that $R^1$, $R^2$, $X^0$, and A may respectively be either the same or different when n is 2 or 3.

[3] The radiation-sensitive resin composition according to [1], wherein the polymer (C) includes a repeating unit shown by a general formula (c1),

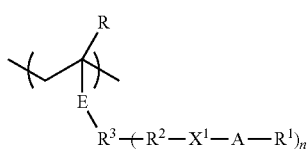

(c1)

wherein E, n, R, $R^1$, $R^2$, $R^3$, and A are the same as defined for the general formula (c0), and $X^1$ represents a single bond, a difluoromethylene group, or a linear or branched perfluoroalkylene group having 2 to 20 carbon atoms.

[4] The radiation-sensitive resin composition according to [1], wherein the polymer (C) includes a repeating unit shown by a general formula (c2),

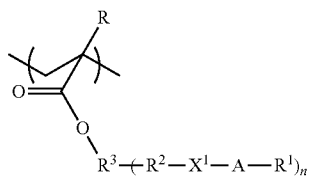

(c2)

wherein n, R, $R^1$, $R^2$, $R^3$, $X^1$, and A are the same as defined for the general formula (c1).

[5] The radiation-sensitive resin composition according to [1], wherein the polymer (C) includes a repeating unit shown by a general formula (c2-1),

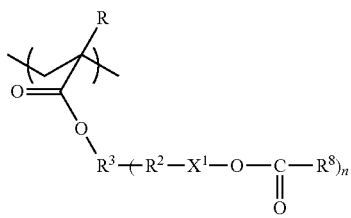

(c2-1)

wherein n, R, $R^2$, $R^3$, and $X^1$ are the same as defined for the general formula (c1), and $R^8$ represents a fluorine-substituted hydrocarbon group having 1 to 10 carbon atoms in which at least one hydrogen atom is substituted with a fluorine atom.

[6] The radiation-sensitive resin composition according to [1], wherein the polymer (C) includes a repeating unit shown by a general formula (c2-2),

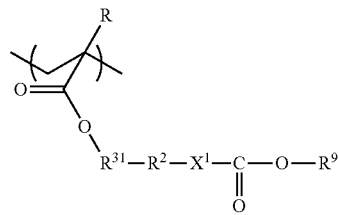

(c2-2)

wherein R, $R^2$, and $X^1$ are the same as defined for the general formula (c1), $R^{31}$ represents a divalent chain-like hydrocarbon group having 1 to 10 carbon atoms or a divalent cyclic hydrocarbon group having 4 to 20 carbon atoms, provided that an oxygen atom, a sulfur atom, an imino group, a carbonyl group, —CO—O—, or —CO—NH— may be bonded to an end of $R^{31}$ that is bonded to $R^2$, and $R^9$ represents a group among groups shown by general formulas (1) to (3),

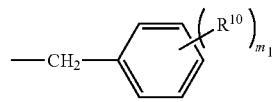

(1)

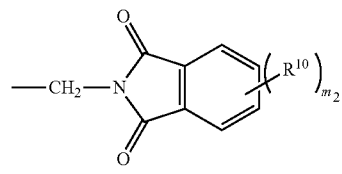

(2)

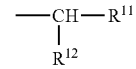

(3)

wherein $R^{10}$ represents a halogen atom, an alkyl group having 1 to 10 carbon atoms, an alkoxy group having 1 to 10 carbon atoms, an acyl group having 1 to 10 carbon atoms, or an acyloxy group having 1 to 10 carbon atoms, provided that a plurality of $R^{10}$ may be either the same or different when a plurality of $R^{10}$ are present, $m_1$ is an integer from 0 to 5, $m_2$ is an integer from 0 to 4, and $R^{11}$ and $R^{12}$ independently represent a hydrogen atom or an alkyl group having 1 to 10 carbon atoms, provided that $R^{11}$ and $R^{12}$ may bond to each other to form an alicyclic hydrocarbon group having 4 to 20 carbon atoms together with a carbon atom bonded to $R^{11}$ and $R^{12}$.

[7] The radiation-sensitive resin composition according to any one of [1] to [6], wherein the polymer (C) further includes a repeating unit shown by a general formula (c3) or a repeating unit shown by a general formula (c4),

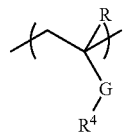

(c3)

wherein R is the same as defined for the general formula (c1), G represents a single bond, an oxygen atom, a sulfur atom, —CO—O—, —SO$_2$—O—NH—, —CO—NH—, or —O—CO—NH—, and $R^4$ represents a fluorine-substituted chain-like hydrocarbon group having 1 to 6 carbon atoms in which at least one hydrogen atom is substituted with a fluorine atom, or a fluorine-substituted cyclic hydrocarbon group having 4 to 20 carbon atoms in which at least one hydrogen atom is substituted with a fluorine atom,

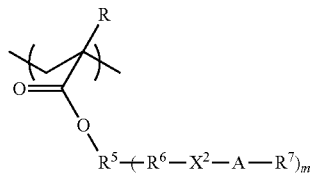

(c4)

wherein R and A are the same as defined for the general formula (c1), $R^7$ represents a hydrogen atom or an acid-labile group, $R^6$ is the same as defined for $R^2$ in the general formula (c1), $R^5$ is the same as defined for $R^3$ in the general formula (c1), $X^2$ is the same as defined for $X^1$ in the general formula (c1), and m is an integer from 1 to 3, provided that $R^6$, $R^7$, $X^2$, and A may respectively be either the same or different when m is 2 or 3.

[8] The radiation-sensitive resin composition according to any one of [1] to [7], including the polymer (C) in an amount of 0.1 to 20 parts by mass based on 100 parts by mass of the polymer (A).

[9] The radiation-sensitive resin composition according to any one of [1] to [8], the radiation-sensitive resin composition being used for liquid immersion lithography.

[10] A method for forming a resist pattern including (1) a film-forming step that includes forming a resist film on a substrate using the radiation-sensitive resin composition according to any one of [1] to [9], (2) an exposure step that includes exposing the resist film by applying radiation to the resist film via a mask pattern, and (3) a development step that includes developing the exposed resist film to form a resist pattern.

[11] The method according to [10], wherein the exposure step (2) includes exposing the resist film formed by the film-forming step (1) via an immersion liquid provided over the resist film.

[12] A polymer comprising a repeating unit shown by a general formula (c0),

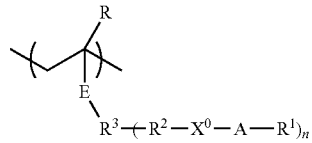

(c0)

wherein $R^1$ represents an alkali-labile group, A represents an oxygen atom, —NR'— (wherein R' represents a hydrogen atom or an alkali-labile group), —CO—O—#, or —SO$_2$—O—## (wherein "#" and "##" indicates a bonding hand bonded to $R^1$), $R^2$ represents a single bond, a divalent chain-like hydrocarbon group having 1 to 10 carbon atoms, or a divalent cyclic hydrocarbon group having 4 to 20 carbon atoms, $X^0$ represents a single bond or a divalent chain-like hydrocarbon group having 1 to 20 carbon atoms in which some or all of hydrogen atoms are substituted with a fluorine atom, $R^3$ represents an (n+1)-valent hydrocarbon group having 1 to 20 carbon atoms, provided that an oxygen atom, a sulfur atom, an imino group, a carbonyl group, —CO—O—, or —CO—NH— may be bonded to an end of $R^3$ that is bonded to $R^2$, E represents an oxygen atom, —CO—O—###, or —CO—NH—#### (wherein "###" and "####" indicates a bonding hand bonded to $R^3$), R represents a hydrogen atom, a methyl group, or a trifluoromethyl group, and n is an integer from 1 to 3, provided that $R^1$, $R^2$, $X^0$, and A may respectively be either the same or different when n is 2 or 3.

[13] A compound shown by a general formula (Mc2-2), the compound being other than compounds shown by formulas (4) and (5),

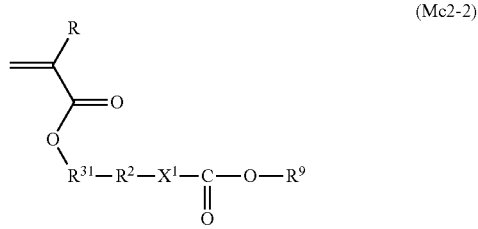

(Mc2-2)

wherein $R^9$ represents a group among groups shown by general formulas (1) to (3), $X^1$ represents a single bond, a difluoromethylene group, or a linear or branched divalent perfluorohydrocarbon group having 2 to 20 carbon atoms, $R^2$ represents a single bond, a methylene group, a linear or branched divalent hydrocarbon group having 2 to 10 carbon atoms, or a divalent cyclic hydrocarbon group having 4 to 20 carbon atoms, $R^{31}$ represents a methylene group, a linear or branched divalent hydrocarbon group having 2 to 10 carbon atoms, or a divalent cyclic hydrocarbon group having 4 to 20 carbon atoms, provided that an oxygen atom, a sulfur atom, an imino group, a carbonyl group, —CO—O—, or —CO—NH— may be bonded to an end of $R^{31}$ that is bonded to $R^2$, and R represents a hydrogen atom, a methyl group, or a trifluoromethyl group,

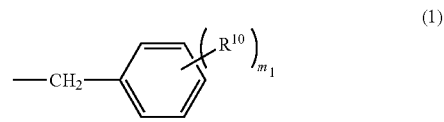

(1)

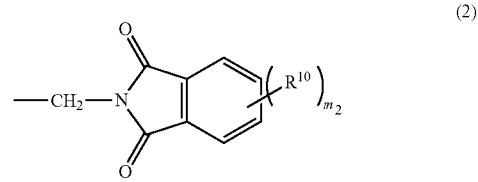

(2)

(3)

wherein $R^{10}$ independently represents a halogen atom, an alkyl group having 1 to 10 carbon atoms, an alkoxy group having 1 to 10 carbon atoms, an acyl group having 1 to 10 carbon atoms, or an acyloxy group having 1 to 10 carbon atoms, $m_1$ is an integer from 0 to 5, $m_2$ is an integer from 0 to 4, and $R^{11}$ and $R^{12}$ independently represent a hydrogen atom or an alkyl group having 1 to 10 carbon atoms, provided that $R^{11}$ and $R^{12}$ may bond to each other to form an alicyclic structure having 4 to 20 carbon atoms together with a carbon atom bonded to $R^{11}$ and $R^{12}$.

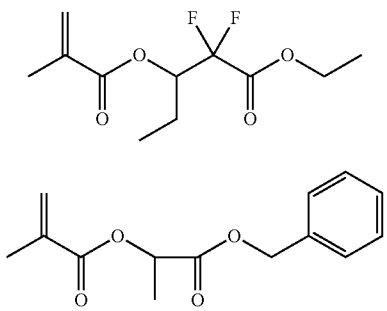

The radiation-sensitive resin composition, the method for forming a resist pattern, and the polymer may produce a resist film that exhibits hydrophobicity during liquid immersion lithography, exhibits improved hydrophilicity during alkali development, suppresses occurrence of development defects in the unexposed area, and ensures an excellent pattern shape after development. The polymerizable compound may be used to synthesize the polymer of the invention.

A radiation-sensitive resin composition, a method for forming a resist pattern, a polymer, and a polymerizable compound according to several embodiments of the invention are described in detail below. Note that the invention is not limited to the following embodiments, but encompasses all possible embodiments within the scope of the invention.

In the following description, an identical substituent is indicated by an identical symbol, and description thereof is omitted. A substituent indicated by an identical symbol is used in an identical preferable manner, unless otherwise specified. The term "hydrocarbon group" used herein includes a chain-like hydrocarbon group, an alicyclic hydrocarbon group, and an aromatic hydrocarbon group. The hydrocarbon group may be either a saturated hydrocarbon group or an unsaturated hydrocarbon group.

The term "chain-like hydrocarbon group" used herein refers to a hydrocarbon group that does not include a cyclic structure in the main chain, and includes only a chain-like structure. The term "chain-like hydrocarbon group" used herein includes a linear hydrocarbon group and a branched hydrocarbon group. The term "alicyclic hydrocarbon group" used herein refers to a hydrocarbon group that includes only an alicyclic hydrocarbon structure as a cyclic structure, and does not include an aromatic ring structure. Note that the alicyclic hydrocarbon group need not necessarily include only an alicyclic hydrocarbon structure, but may also include a chain-like structure. The term "aromatic hydrocarbon group" used herein refers to a hydrocarbon group that includes an aromatic ring as a ring structure. Note that the aromatic hydrocarbon group need not necessarily include only an aromatic ring structure, but may also include a chain structure or an alicyclic hydrocarbon structure.

[1] Polymer (C)

A polymer (C) includes a fluorine atom and a functional group shown by the following general formula (x) (hereinafter may be referred to as "functional group (x)").

When forming a resist film using a radiation-sensitive resin composition that includes the polymer (C) and a polymer (A) described later, the polymer (C) tends to be highly distributed in the surface layer (surface) of the resist film due to the oil repellency of the polymer (C). Specifically, the polymer (A) is unevenly distributed in the surface layer of the resist film. This makes it unnecessary to form an upper-layer film that isolates a photoresist film from an immersion medium. Therefore, it may suitably be used for liquid immersion lithography.

Since the alkali-labile group included in the functional group (x) dissociates due to hydrolysis to produce a polar group during alkali development, the water repellency of the surface of the resist film can be reduced. This makes it possible to suppress occurrence of development defects that may occur in the resist film after alkali development. It is also possible to form a photoresist film that exhibits an excellent pattern shape and the like as compared with the case of using a polymer that produces a phenolic hydroxyl group during alkali development.

[1-1] Functional Group (x)

The polymer (C) includes the functional group (x) shown by the following general formula (x).

The functional group (x) undergoes the following reaction with an alkaline aqueous solution to produce a polar group.

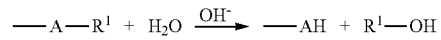

A in the general formula (x) represents an oxygen atom (excluding an oxygen atom that is bonded directly to an aromatic ring, a carbonyl group, or a sulfoxyl group), —NR'— (wherein R' represents a hydrogen atom or an alkali-labile group), —CO—O—#, or —SO$_2$—O—## (wherein "#" and "##" indicates a bonding hand bonded to $R^1$). Specifically, the functional group (x) has a structure in which a hydroxyl group, an amino group, a carboxyl group, or a sulfoxyl group is modified with an alkali-labile group.

$R^1$ in the general formula (x) represents an alkali-labile group. The term "alkali-labile group" used herein refers to a group that substitutes a hydrogen atom of a polar functional group, and dissociates in the presence of an alkali (e.g., 2.38 mass % tetramethylammonium hydroxide aqueous solution (23° C.)).

The alkali-labile group is not particularly limited as long as the alkali-labile group has the above properties. Examples of the alkali-labile group when A in the general formula (x) represents an oxygen atom or —NR'— include a group shown by the following general formula (0).

wherein $R^8$ represents a hydrocarbon group having 1 to 10 carbon atoms in which at least one hydrogen atom is substituted with a fluorine atom.

$R^8$ preferably represents a linear or branched alkyl group having 1 to 10 carbon atoms or an alicyclic hydrocarbon group having 3 to 20 carbon atoms in which some or all of the hydrogen atoms are substituted with a fluorine atom, for example.

Examples of the alkyl group include a methyl group, an ethyl group, a 1-propyl group, a 2-propyl group, a 1-butyl group, a 2-butyl group, a 2-(2-methylpropyl) group, a 1-pentyl group, a 2-pentyl group, a 3-pentyl group, a 1-(2-methylbutyl) group, a 1-(3-methylbutyl) group, a 2-(2-methylbutyl) group, a 2-(3-methylbutyl) group, a neopentyl group, a 1-hexyl group, a 2-hexyl group, a 3-hexyl group, a 1-(2-methylpentyl) group, a 1-(3-methylpentyl) group, a 1-(4-methylpentyl) group, a 2-(2-methylpentyl) group, a 2-(3-methylpentyl) group, a 2-(4-methylpentyl) group, a 3-(2-methylpentyl) group, a 3-(3-methylpentyl) group, and the like.

Examples of the alicyclic hydrocarbon group include a cyclopentyl group, a cyclopentylmethyl group, a 1-(1-cyclopentylethyl) group, a 1-(2-cyclopentylethyl) group, a cyclohexyl group, a cyclohexylmethyl group, a 1-(1-cyclohexylethyl) group, a 1-(2-cyclohexylethyl) group, a cycloheptyl group, a cycloheptylmethyl group, a 1-(1-cycloheptylethyl) group, a 1-(2-cycloheptylethyl) group, a 2-norbornyl group, and the like.

$R^8$ more preferably represents a linear or branched perfluoroalkyl group having 1 to 10 carbon atoms in which all of the hydrogen atoms of the hydrocarbon group are substituted with a fluorine atom, and particularly preferably represents a trifluoromethyl group.

The functional group (x) may be formed by fluoroacylation of an alcohol, an amine, or a carboxylic acid using a known method. For example, the functional group (x) may be formed by 1) esterification of an alcohol and a fluorocarboxylic acid in the presence of an acid, 2) esterification of an alcohol and a fluorocarboxylic acid halide in the presence of a base, or the like.

Examples where A in the general formula (x) represents —CO—O—# include groups shown by the following general formulas (1) to (3).

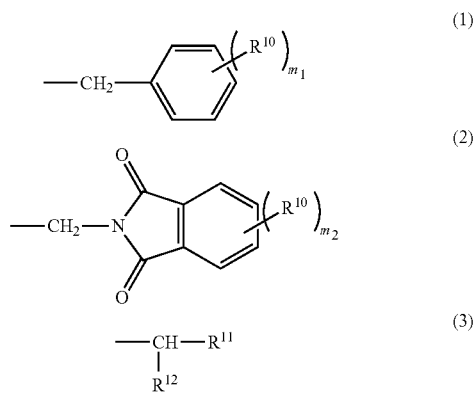

wherein $R^{10}$ represents a halogen atom, an alkyl group having 1 to 10 carbon atoms, an alkoxy group having 1 to 10 carbon atoms, an acyl group having 1 to 10 carbon atoms, or an acyloxy group having 1 to 10 carbon atoms, provided that a plurality of $R^{10}$ may be either the same or different when a plurality of $R^{10}$ are present, $m_1$ is an integer from 0 to 5, $m_2$ is an integer from 0 to 4, and $R^{11}$ and $R^{12}$ in the general formula (3), independently represent a hydrogen atom or an alkyl group having 1 to 10 carbon atoms, provided that $R^{11}$ and $R^{12}$ may bond to each other to form an alicyclic hydrocarbon group having 4 to 20 carbon atoms.

Examples of the halogen atom represented by $R^{10}$ in the general formulas (1) and (2) include a fluorine atom, a chlorine atom, a bromine atom, an iodine atom, and the like. Among these, a fluorine atom is preferable.

Examples of the alkyl group having 1 to 10 carbon atoms represented by $R^{10}$ in the general formulas (1) and (2) include those mentioned above in connection with $R^8$.

Examples of the alkoxy group having 1 to 10 carbon atoms represented by $R^{10}$ in the general formulas (1) and (2) include a methoxy group, an ethoxy group, an n-butoxy group, a t-butoxy group, a propoxy group, an isopropoxy group, and the like.

Examples of the acyl group having 1 to 10 carbon atoms represented by $R^{10}$ in the general formulas (1) and (2) include an acetyl group, an ethylcarbonyl group, a propylcarbonyl group, and the like.

Examples of the acyloxy group having 1 to 10 carbon atoms represented by $R^{10}$ in the general formulas (1) and (2) include an acetoxy group, an ethryloxy group, a butyryloxy group, a t-butyryloxy group, a t-amyryloxy group, an n-hexanecarbonyloxy group, an n-octanecarbonyloxy group, and the like.

Examples of the alkyl group having 1 to 10 carbon atoms represented by $R^{11}$ or $R^{12}$ in the general formula (3) include those mentioned above in connection with $R^{10}$.

Examples of the alicyclic hydrocarbon structure formed by $R^{11}$ and $R^{12}$ together with the carbon atom bonded to $R^{11}$ and $R^{12}$ include a cyclopentyl group, a cyclopentylmethyl group, a 1-(1-cyclopentylethyl) group, a 1-(2-cyclopentylethyl) group, a cyclohexyl group, a cyclohexylmethyl group, a 1-(1-cyclohexylethyl) group, a 1-(2-cyclohexylethyl) group, a cycloheptyl group, a cycloheptylmethyl group, a 1-(1-cycloheptylethyl) group, a 1-(2-cycloheptylethyl) group, a 2-norbornyl group, and the like.

Specific examples of the group shown by the general formula (3) include those mentioned above in connection with the alkyl group having 1 to 10 carbon atoms represented by $R^8$. Among these, a methyl group, an ethyl group, a 1-propyl group, a 2-propyl group, a 1-butyl group, and a 2-butyl group are preferable.

[1-2] Fluorine Atom Content

The fluorine atom content in the polymer (C) is preferably 5 mass % or more, more preferably 5 to 50 mass %, and particularly preferably 5 to 40 mass % based on the total mass % of the polymer (C) of 100 mass %. The fluorine atom content may be determined by $^{13}C$-NMR analysis. If the fluorine atom content in the polymer (C) is within the above range, the surface of a resist film formed using a radiation-sensitive resin composition that includes the polymers (C) and (A) described later exhibits improved water repellency. This makes it unnecessary to form an upper-layer film for liquid immersion lithography.

[1-3] Repeating Units (c0) and (c1)

The polymer (C) may include a repeating unit shown by the following general formula (c0) (hereinafter may be referred to as "repeating unit (c0)"). The repeating unit (c0) has a structure in which the functional group (x) is bonded to the main chain via $X^0$, $R^2$, $R^3$, and E. R in the general formula (c0) represents a hydrogen atom, a methyl group, or a trifluoromethyl group.

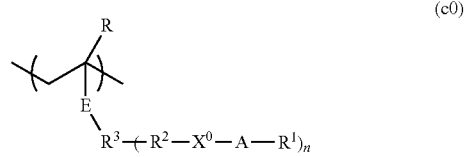

$X^0$ in the general formula (c0) represents a single bond or a divalent chain-like hydrocarbon group having 1 to 20 carbon atoms in which some or all of the hydrogen atoms are substituted with a fluorine atom. Examples of the divalent hydrocarbon group having 1 to 20 carbon atoms in which some or all of the hydrogen atoms are substituted with a fluorine atom, include a group shown by the following formula (X0). p in the general formula (X0) is an integer from 1 to 4. $Rf^0$ independently represent a hydrogen atom, a fluorine atom, or a perfluoroalkyl group having 1 to 10 carbon atoms, provided that a case where all of $Rf^0$ represent a hydrogen atom is excluded.

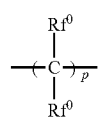

(X0)

Specific examples of the structure shown by the general formula (X0) include the structure shown by the following formula (X0a).

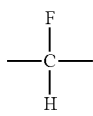

(X0a)

A repeating unit shown by the following general formula (c1) is preferable as the repeating unit shown by the general formula (c0).

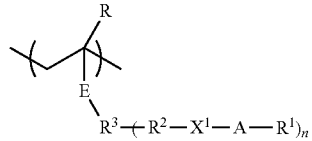

(c1)

wherein $X^1$ represents a single bond, a difluoromethylene group, or a linear or branched perfluoroalkylene group having 2 to 20 carbon atoms.

Specific examples of the structure represented by $X^1$ include a group shown by the following formula (X1).

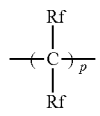

(X1)

wherein p is an integer from 1 to 4, and Rf independently represent a fluorine atom or a perfluoroalkyl group having 1 to 10 carbon atoms.

Specific examples of the structure shown by the general formula (X1) include the groups shown by the following formulas (X1a) and (X1b).

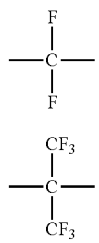

(X1a)

(X1b)

wherein $R^3$ represents a single bond or an (n+1)-valent hydrocarbon group having 1 to 20 carbon atoms, and n is an integer from 1 to 3. Therefore, the repeating unit (c0) includes one, two, or three functional groups (x). $R^1$, $R^2$, and A may respectively be either the same or different when n is 2 or 3. Specifically, a plurality of functional groups (x) may have either the same structure or different structures when n is 2 or 3. When n is 2 or 3, a plurality of functional groups (x) may be bonded to an identical carbon atom included in the hydrocarbon group represented by $R^2$, or may be bonded to different carbon atoms included in the hydrocarbon group represented by $R^2$.

Examples of the hydrocarbon group represented by $R^3$ include an (n+1)-valent hydrocarbon group obtained by removing (n+1) hydrogen atoms from a chain-like hydrocarbon having 1 to 10 carbon atoms (e.g., methane, ethane, propane, butane, 2-methylpropane, pentane, 2-methylbutane, 2,2-dimethylpropane, hexane, heptane, octane, nonane, or decane), and the like.

Examples of the hydrocarbon group represented by $R^3$ include an (n+1)-valent hydrocarbon group obtained by removing (n+1) hydrogen atoms from an alicyclic hydrocarbon (e.g., cyclobutane, cyclopentane, cyclohexane, bicyclo[2.2.1]heptane, bicyclo[2.2.2]octane, tricyclo[5.2.1.0$^{2,6}$]decane, or tricyclo[3.3.1.1$^{3,7}$]decane), an (n+1)-valent hydrocarbon group obtained by removing (n+1) hydrogen atoms from an aromatic hydrocarbon (e.g., benzene or naphthalene), and the like.

Examples of a structure in which an oxygen atom, a sulfur atom, an imino group, a carbonyl group, —CO—O—, or —CO—NH— is bonded to the end of $R^3$ that is bonded to $R^2$ include structures shown by the following general formulas. Note that "*" indicates a bonding hand bonded to $R^2$.

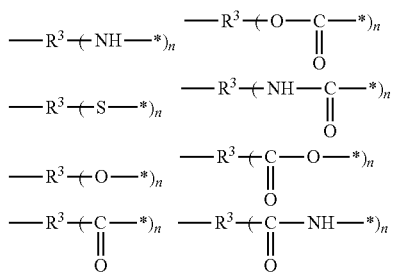

Examples of the divalent chain-like hydrocarbon group having 1 to 20 carbon atoms represented by $R^2$ in the general formula (c0) include a divalent hydrocarbon group derived from a linear or branched alkyl group having 1 to 20 carbon atoms (e.g., methyl group, ethyl group, n-propyl group, i-propyl group, n-butyl group, 2-methylpropyl group, 1-methylpropyl group, t-butyl group, pentyl group, isopentyl group, neopentyl group, hexyl group, heptyl group, octyl group, nonyl group, or decyl group), and the like.

Examples of the divalent cyclic hydrocarbon group include a group derived from an alicyclic hydrocarbon having 3 to 20 carbon atoms or an aromatic hydrocarbon, and the like. Examples of the alicyclic hydrocarbon include the hydrocarbon groups in which n=1 mentioned above in connection with the (n+1)-valent cyclic hydrocarbon group represented by $R^3$. Specific examples of the aromatic hydrocarbon include benzene, naphthalene, and the like.

The hydrocarbon group represented by $R^2$ in the general formula (c0) may be a group in which at least one hydrogen atom is substituted with at least one of a linear, branched, or cyclic alkyl group having 1 to 12 carbon atoms, such as a methyl group, an ethyl group, an n-propyl group, an i-propyl group, an n-butyl group, a 2-methylpropyl group, a 1-methylpropyl group, or a t-butyl group, a hydroxyl group, a cyano group, a hydroxyalkyl group having 1 to 10 carbon atoms, a carboxyl group, an oxygen atom, and the like.

[1-4] Repeating Unit (c2)

It is preferable that E in the general formula (c1) represent —CO—O—$^{\#\#\#}$. Specifically, it is preferable that the polymer (C) include a repeating unit shown by the following general formula (c2) (hereinafter may be referred to as "repeating unit (c2)") as the repeating unit (c1).

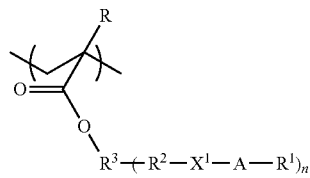
(c2)

Examples of the repeating unit (c2) include a repeating unit shown by the following general formula (c2-1) (hereinafter may be referred to as "repeating unit (c2-1)") and a repeating unit shown by the following general formula (c2-2) (hereinafter may be referred to as "repeating unit (c2-2)").

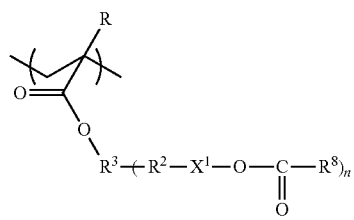
(c2-1)

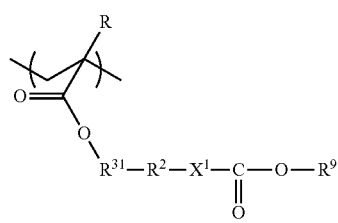
(c2-2)

wherein $R^{31}$ represents a methylene group, a linear or branched alkylene group having 2 to 10 carbon atoms, or a divalent cyclic hydrocarbon group having 4 to 20 carbon atoms, provided that an oxygen atom, a sulfur atom, an imino group, a carbonyl group, —CO—O—, or —CO—NH— is bonded to the end of $R^{31}$ that is bonded to $R^2$, and $R^9$ represents a group among the groups shown by the general formulas (1) to (3) mentioned above in connection with R'.

Specific examples of the group represented by $R^{31}$ include those mentioned above in connection with $R^3$ when n=1.

[1-4-1] Repeating Unit (c2-1)

Specific examples of the repeating unit (c2-1) include repeating units shown by the following formulas (c2-1-1) and (c2-1-2).

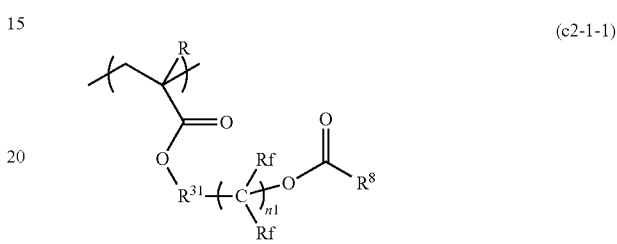
(c2-1-1)

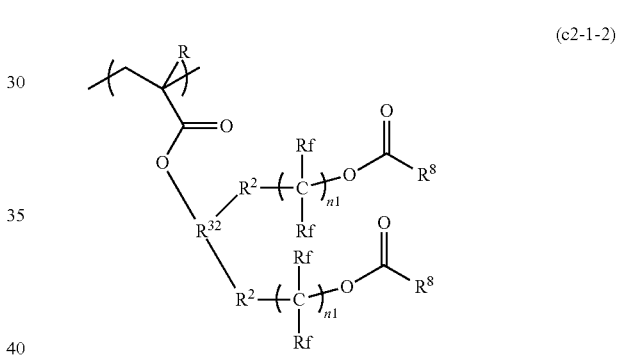
(c2-1-2)

wherein n1 is or are independently an integer from 0 to 4, Rf independently represent a fluorine atom or a perfluoroalkyl group having 1 to 10 carbon atoms (preferably a fluorine atom or a trifluoromethyl group), and $R^{32}$ represents a trivalent linear or branched hydrocarbon group having 1 to 10 carbon atoms or a trivalent cyclic hydrocarbon group having 4 to 20 carbon atoms provided that an oxygen atom, a sulfur atom, a carbonyl group, or an imino group may be bonded to the end of $R^{32}$ that is bonded to $R^2$. Specific examples of the group represented by $R^{32}$ include those mentioned above in connection with $R^3$ when n=2.

When n1 in the general formulas (c2-1-1) and (c2-1-2) is an integer equal to or larger than 1, an OH group that includes a fluorine atom or a perfluoroalkyl group is produced at the α-position due to a reaction with an alkaline aqueous solution. Such an OH group has a low pKa as compared with an alcoholic OH group. Therefore, it is preferable in view of improvement of hydrophilicity.

Specific examples of the repeating unit shown by the general formula (c2-1-1) include repeating units shown by the following general formulas (c2-1-1a) to (c2-1-1d). Specific examples of the repeating unit shown by the general formula (c2-1-2) include repeating units shown by the following general formulas (c2-1-2a) and (c2-1-2b).

(c2-1-1a)
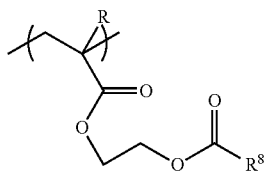

(c2-1-1b)
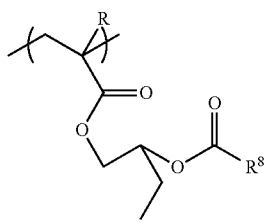

(c2-1-1c)
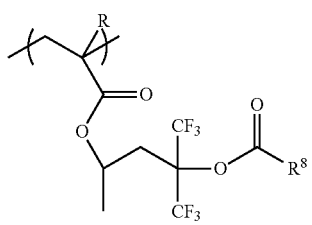

(c2-1-1d)
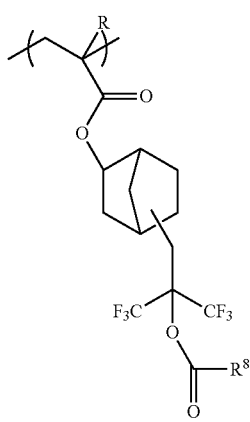

(c2-1-2a)
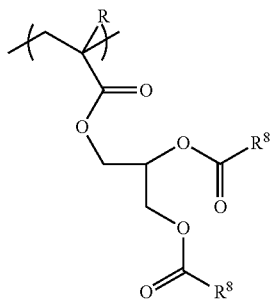

(c2-1-2b)
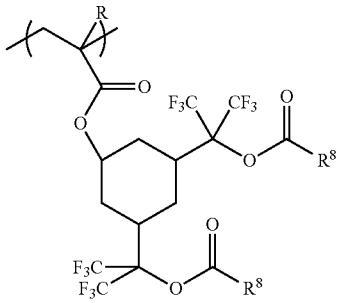

[1-4-2] Repeating Unit (c2-2)

Specific examples of the repeating unit (c2-2) include repeating units shown by the following general formulas (c2-2-1) to (c2-2-2).

(c2-2-1)
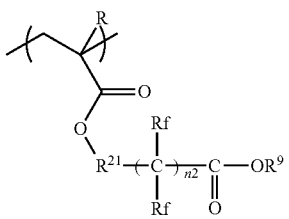

(c2-2-2)
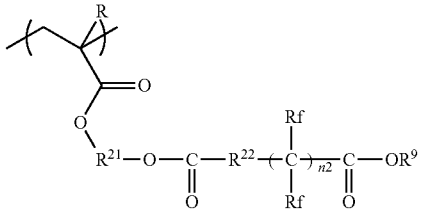

wherein n2 is independently an integer from 0 to 4, Rf independently represent a fluorine atom or a perfluoroalkyl group having 1 to 10 carbon atoms (preferably a fluorine atom or a trifluoromethyl group), $R^{21}$ represents a methylene group, a linear or branched alkylene group having 2 to 10 carbon atoms, or a divalent cyclic hydrocarbon group having 4 to 20 carbon atoms, and $R^{22}$ represents a single bond or the group in connection with $R^{21}$.

When n2 in the general formulas (c2-2-1) and (c2-2-2) is an integer equal to or larger than 1, a fluorine atom or a perfluoroalkyl group is present at the α-position of the carbonyloxy group, so that the reactivity with an alkaline aqueous solution is considered to be improved. A COOH group produced due to hydrolysis of the alkali-labile group has a low pKa. Therefore, it is preferable in view of improvement of hydrophilicity.

Specific examples of the repeating unit shown by the general formula (c2-2-1) include repeating units shown by the following general formulas (c2-2-1a) and (c2-2-1b). Specific examples of the repeating unit shown by the general formula (c2-2-2) include repeating units shown by the following general formulas (c2-2-2a) and (c2-2-2b).

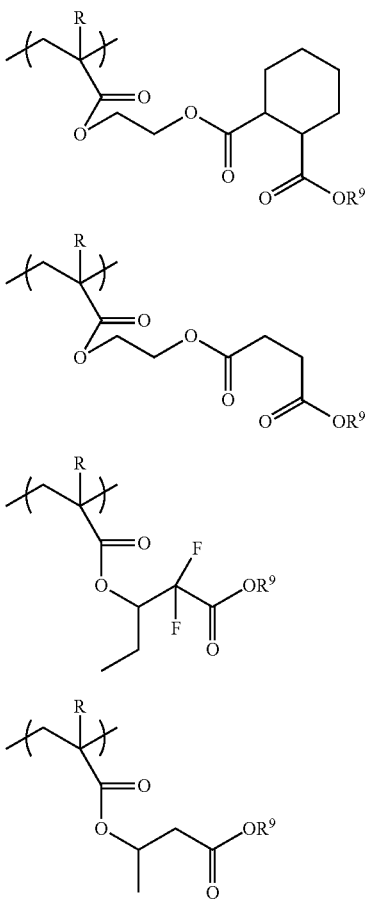

[1-5] Repeating Unit (c3)

The polymer (C) preferably includes a repeating unit (c3) shown by the following general formula (c3) in addition to the repeating unit (c1).

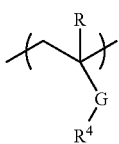
(c3)

wherein G represents a single bond, an oxygen atom, a sulfur atom, —CO—O—, —SO$_2$—O—NH—, —CO—NH—, or —O—CO—NH—, and $R^4$ represents a fluorine-substituted chain-like hydrocarbon group having 1 to 6 carbon atoms in which at least one hydrogen atom is substituted with a fluorine atom, or a fluorine-substituted cyclic hydrocarbon group having 4 to 20 carbon atoms in which at least one hydrogen atom is substituted with a fluorine atom.

Examples of a monomer that produces the repeating unit (c3) include 2,2,2-trifluoroethyl(meth)acrylate, 2-(1,1,1,3,3,3-hexafluoropropyl)(meth)acrylate, and the like.

[1-6] Repeating Unit (c4)

The polymer (C) preferably includes a repeating unit (c4) shown by the following general formula (c4) in addition to the repeating unit (c1).

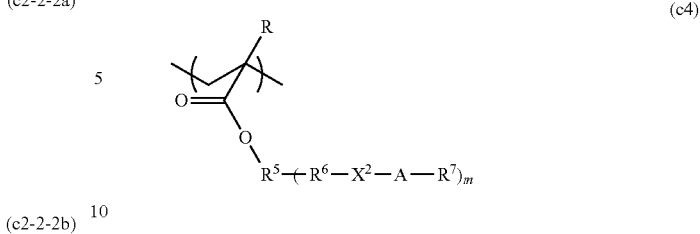

wherein $R^6$ is the same as defined for $R^2$ in the general formula (c1), $R^5$ is the same as defined for $R^3$ in the general formula (c1), and $X^2$ is the same as defined for $X^1$ in the general formula (c1).

$R^7$ in the general formula (c4) represents a hydrogen atom or an acid-labile group. The term "acid-labile group" used herein refers to a group that substitutes a hydrogen atom of a polar functional group (e.g., hydroxyl group or carboxyl group), and dissociates in the presence of an acid.

Specific examples of the acid-labile group include a t-butoxycarbonyl group, a tetrahydropyranyl group, a tetrahydrofuranyl group, a (thiotetrahydropyranylsulfanyl) methyl group, a (thiotetrahydrofuranylsulfanyl)methyl group, an alkoxy-substituted methyl group, an alkylsulfanyl-substituted methyl group, and the like. Examples of the alkoxy group (substituent) of the alkoxy-substituted methyl group include alkoxy groups having 1 to 4 carbon atoms. Examples of the alkyl group (substituent) of the alkylsulfa-nyl-substituted methyl group include alkyl groups having 1 to 4 carbon atoms. The acid-labile group may be a group shown by a general formula (6) described later in connection with a repeating unit (c5).

m in the general formula (c4) is an integer from 1 to 3. Therefore, the repeating unit (c4) includes one, two, or three $R^7$. $R^6$, $R^7$, $X^2$, and A may respectively be either the same or different when m is 2 or 3. Specifically, a plurality of $R^7$ may have either the same structure or different structures when m is 2 or 3. When m is 2 or 3, a plurality of $R^6$ may be bonded to an identical carbon atom included in the hydrocarbon group represented by $R^5$, or may be bonded to different carbon atoms included in the hydrocarbon group represented by $R^5$.

Specific examples of the repeating unit (c4) include repeating units shown by the following general formulas (c4-1) to (c4-3).

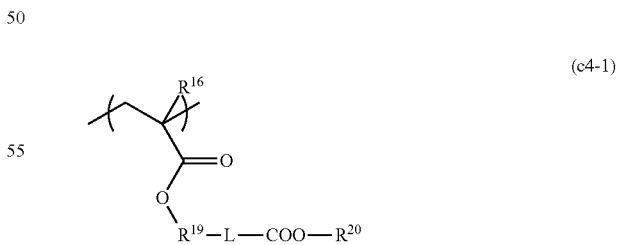
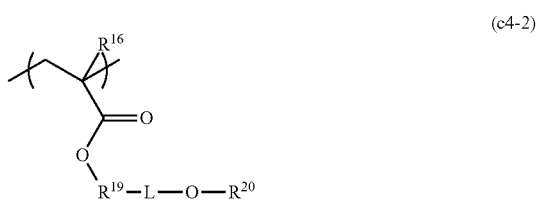

(c4-3)

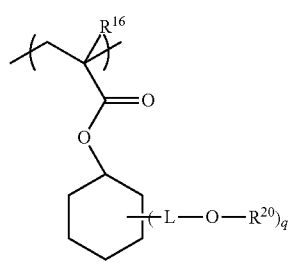

wherein $R^{16}$ represents a hydrogen atom, a methyl group, or a trifluoromethyl group, L represents a methylene group substituted with a fluorine atom, or a linear or branched fluoroalkylene group having 2 to 20 carbon atoms, $R^{20}$ represents a hydrogen atom or an acid-labile group, $R^{19}$ represents a single bond or a linear, branched, or cyclic saturated or unsaturated divalent hydrocarbon group having 1 to 20 carbon atoms, and q is an integer from 1 to 3, provided that L and $R^{20}$ may respectively be either the same or different when q is 2 or 3.

Specific examples of a monomer that produces the repeating unit (c4-1) include a compound shown by the following general formula (Mc4-1a). Specific examples of a monomer that produces the repeating unit (c4-2) include compounds shown by the following general formulas (Mc4-2a) to (Mc4-2d). Specific examples of a monomer that produces the repeating unit (c4-3) include a compound shown by the following general formula (Mc4-3 a).

(Mc4-1a)

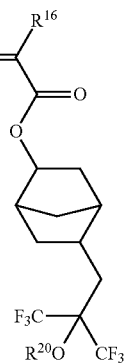

(Mc4-2a)

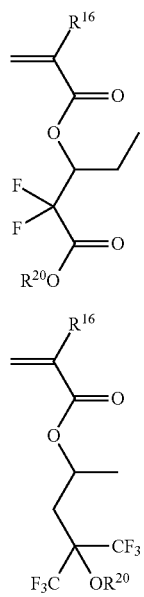

(Mc4-2b)

(Mc4-2c)

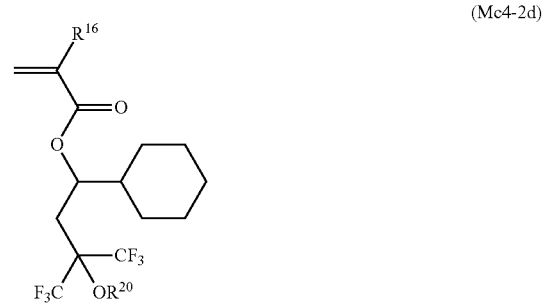

(Mc4-2d)

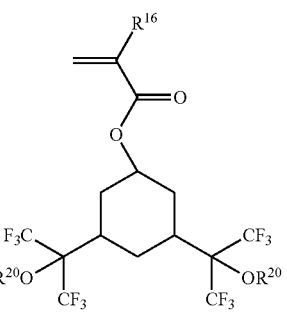

(Mc4-3a)

[1-7] Repeating Unit (c5)

The polymer (C) may include a repeating unit (c5) shown by the following general formula (c5) in addition to the repeating unit (c1). If the polymer (C) includes the repeating unit (c5), the shape of the resist pattern obtained by development can be further improved.

(c5)

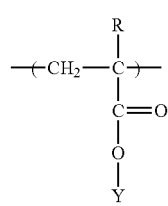

Y in the general formula (c5) represents an acid-labile group. Y preferably represents a group shown by the following general formula (6).

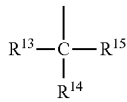
(6)

wherein $R^{13}$ represents an alkyl group having 1 to 4 carbon atoms or a monovalent alicyclic hydrocarbon group having 4 to 20 carbon atoms, and $R^{14}$ and $R^{15}$ independently represent an alkyl group having 1 to 4 carbon atoms or a monovalent alicyclic hydrocarbon group having 4 to 20 carbon atoms, or bond to each other to form a divalent alicyclic hydrocarbon group having 4 to 20 carbon atoms together with the carbon atom bonded to $R^{14}$ and $R^{15}$.

Examples of the alkyl group having 1 to 4 carbon atoms represented by $R^{13}$ to $R^{15}$ in the general formula (6) include a methyl group, an ethyl group, an n-propyl group, an i-propyl group, an n-butyl group, a 2-methylpropyl group, a 1-methylpropyl group, a t-butyl group, and the like. Examples of the monovalent alicyclic hydrocarbon group having 4 to 20 carbon atoms or the divalent alicyclic hydrocarbon group having 4 to 20 carbon atoms formed by $R^{14}$ and $R^{15}$ together with the carbon atom bonded to $R^{14}$ and $R^{15}$ include a group having an alicyclic skeleton, such as groups having a bridged skeleton (e.g., adamantane skeleton or norbornane skeleton) or a cycloalkane skeleton (e.g., cyclopentane skeleton or cyclohexane skeleton), and groups obtained by substituting these groups with at least one linear, branched, or cyclic alkyl group having 1 to 10 carbon atoms (e.g., methyl group, ethyl group, n-propyl group, or i-propyl group). Among these, a group having a cycloalkane skeleton is preferable since the shape of the resist pattern obtained by development can be further improved.

Specific examples of the repeating unit (c5) include repeating units shown by the following general formulas (c5-1) to (c5-4).

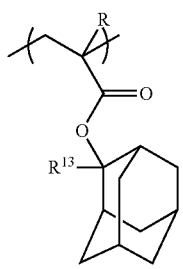
(c5-1)

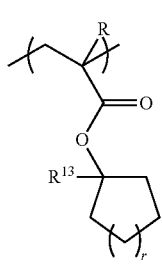
(c5-2)

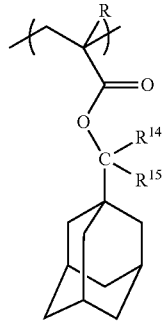
(c5-3)

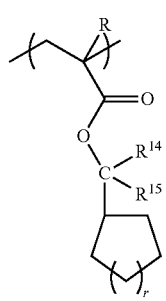
(c5-4)

wherein r is an integer from 1 to 3.

The polymer (C) may include only one type of repeating unit (c5), or may include two or more types of repeating unit (c5).

[1-8] Repeating Unit (c6)

The polymer (C) may include a repeating unit that includes an alkali-soluble group (hereinafter may be referred to as "repeating unit (c6)") in addition to the repeating unit (c1). If the polymer (C) includes the repeating unit (c6), affinity to a developer can be improved.

The alkali-soluble group included in the repeating unit (c6) is preferably a functional group that includes a hydrogen atom having a pKa of 4 to 11. This is because of a view point that the solubility of the polymer (C) in a developer can be improved. Specific examples of such a functional group include functional groups shown by the following general formulas (7) and (8), and the like.

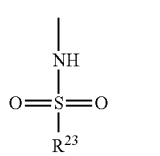
(7)

(8)

wherein $R^{23}$ represents a hydrocarbon group having 1 to 10 carbon atoms that is substituted with a fluorine atom.

The hydrocarbon group having 1 to 10 carbon atoms that is substituted with a fluorine atom represented by $R^{23}$ in the general formula (7) is not particularly limited as long as the hydrocarbon group is a hydrocarbon group having 1 to 10 carbon atoms in which some or all of the hydrogen atoms are substituted with a fluorine atom. For example, $R^{23}$ preferably represents a trifluoromethyl group or the like.

The main chain skeleton of the repeating unit (c6) is not particularly limited, but is preferably a methacrylate skeleton, an acrylate skeleton, an α-trifluoroacrylate skeleton, or the like.

Examples of the repeating unit (c6) include repeating units derived from compounds shown by the following general formulas (Mc6-1) and (Mc6-2).

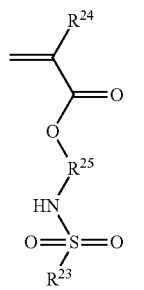

(Mc6-1)

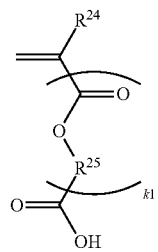

(Mc6-2)

wherein $R^{24}$ is the same as defined for R in the general formula (c0), $R^{25}$ represents a single bond or a linear, branched, or cyclic saturated or unsaturated divalent hydrocarbon group having 1 to 20 carbon atoms, $R^{23}$ represents a hydrocarbon group having 1 to 10 carbon atoms that is substituted with a fluorine atom, and k1 is 0 or 1.

The group represented by $R^{25}$ in the general formulas (Mc6-1) and (Mc6-2) is the same as defined for $R^2$ in the general formula (c1).

[1-9] Repeating Unit (c7)

The polymer (C) may include a repeating unit (c7) shown by the following general formula (c7) in addition to the repeating unit (c1). If the polymer (C) includes the repeating unit (c7), affinity to a developer can be improved.

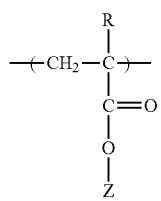

(c7)

wherein Z represents a group that includes a lactone skeleton or a cyclic carbonate structure.

[1-9-1] Repeating Unit (c7-1)

Examples of a repeating unit (c7-1) that includes a lactone skeleton and falls under the repeating unit (c7) include repeating units shown by the following general formulas (c7-1-1) to (c7-1-6).

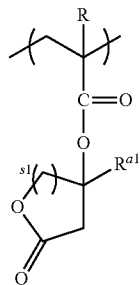

(c7-1-1)

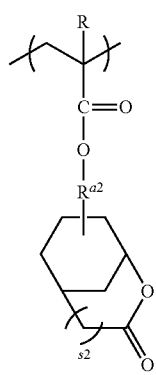

(c7-1-2)

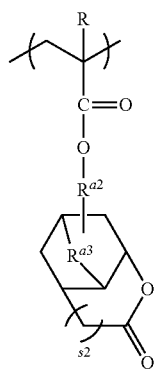

(c7-1-3)

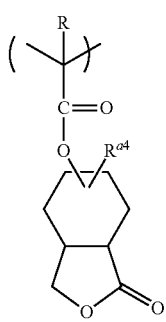

(c7-1-4)

(c7-1-5)

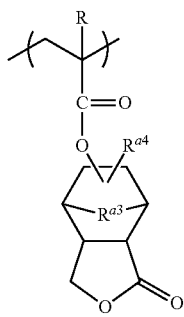

(c7-1-6)

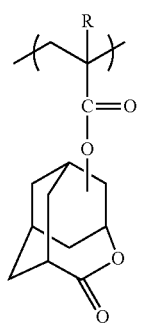

wherein $R^{a1}$ represents a hydrogen atom or a substituted or unsubstituted alkyl group having 1 to 4 carbon atoms, s1 is an integer from 1 to 3, $R^{a4}$ represents a hydrogen atom or a methoxy group, $R^{a2}$ represents a single bond, an ether group, an ester group, a carbonyl group, a divalent chain-like hydrocarbon group having 1 to 30 carbon atoms, a divalent alicyclic hydrocarbon group having 3 to 30 carbon atoms, a divalent aromatic hydrocarbon group having 6 to 30 carbon atoms, or a divalent group formed by combining these groups, s2 is 0 or 1, and $R^{a3}$ represents an oxygen atom or a methylene group. These repeating units may be substituted with a substituent. Examples of the substituent include the groups mentioned above in connection with $R^{10}$, a hydroxyl group, and a cyano group.

Specific examples of the repeating unit (c7-1) include repeating units shown by the following general formulas.

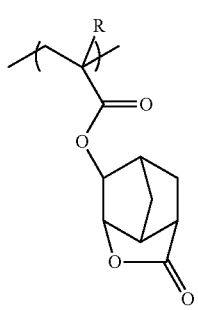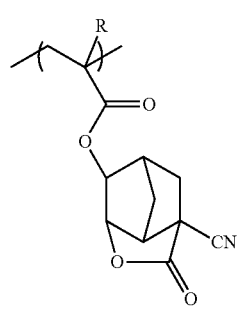

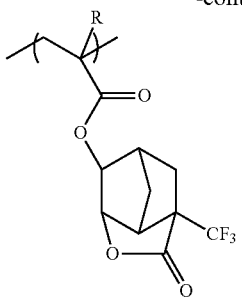

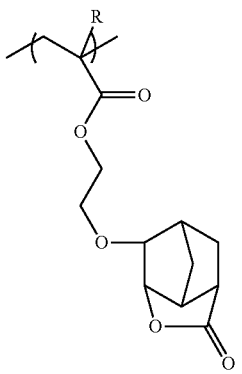

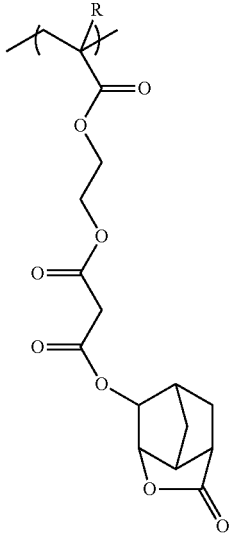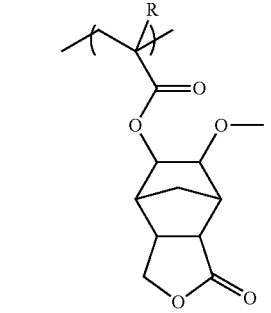

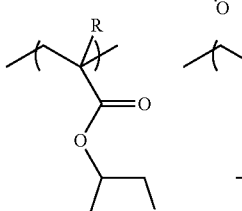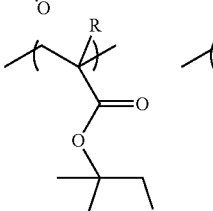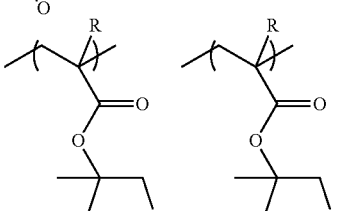

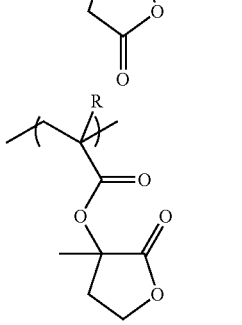

Examples of a monomer that produces each repeating unit include the monomers disclosed in paragraph [0043] of WO2007/116664.

[1-9-2] Repeating Unit (c7-2)

Examples of a repeating unit (c7-2) that includes a group that includes a cyclic carbonate structure include a repeating unit shown by the following general formula (c7-2-1).

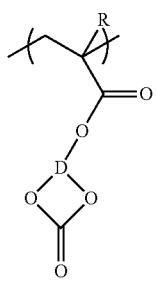

(c7-2-1)

wherein D represents a trivalent chain-like hydrocarbon group having 1 to 30 carbon atoms, a trivalent alicyclic hydrocarbon group having 3 to 30 carbon atoms, or a trivalent aromatic hydrocarbon group having 6 to 30 carbon atoms. Note that the group represented by D may include an oxygen atom, a carbonyl group, or —NR"— (wherein R" represents a hydrogen atom or a monovalent organic group) in the skeleton. The group represented by D may be substituted with a substituent.

Examples of a substituent that substitute the group represented by D include the groups mentioned above in connection with $R^{10}$, and a hydroxyl group.

A monomer that produces the repeating unit shown by the general formula (c7-2-1) may be synthesized by the known method disclosed in Tetrahedron Letters, Vol. 27, No. 32, p. 3741 (1986), Organic Letters, Vol. 4, No. 15, p. 2561 (2002), or the like.

Examples of a particularly preferable repeating unit shown by the general formula (c7-2-1) include repeating units shown by the following general formulas.

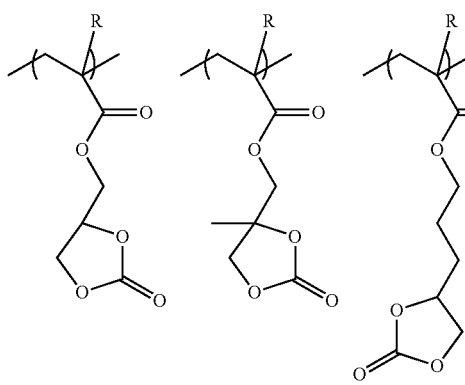

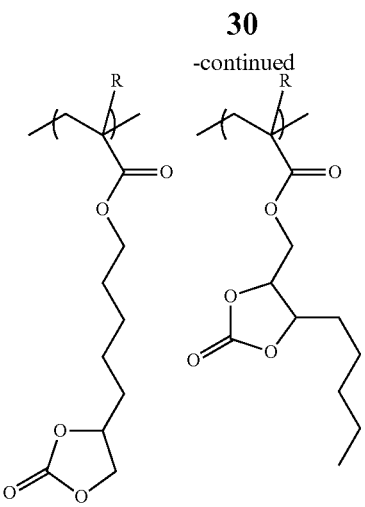

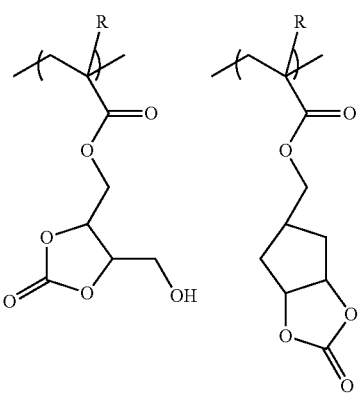

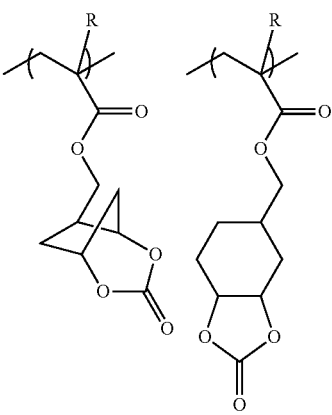

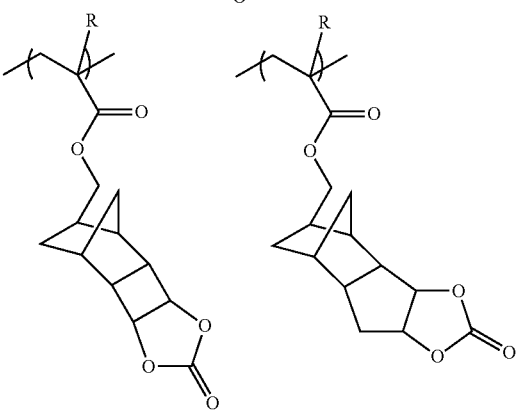

-continued

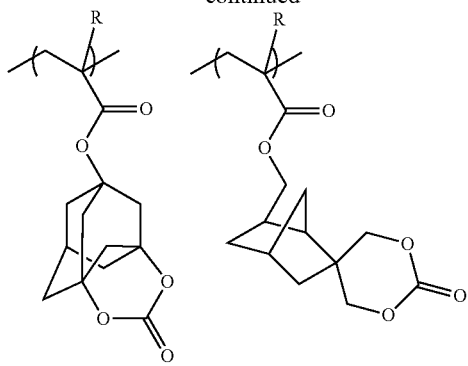

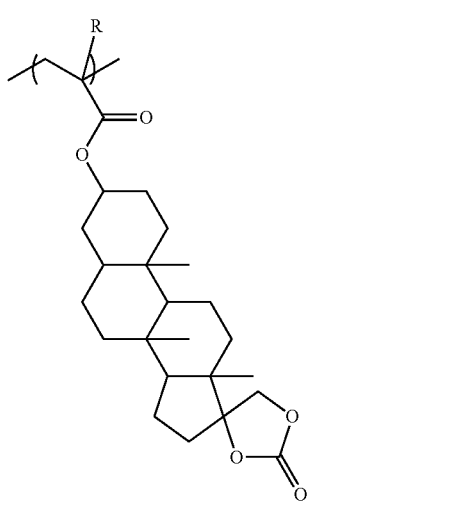

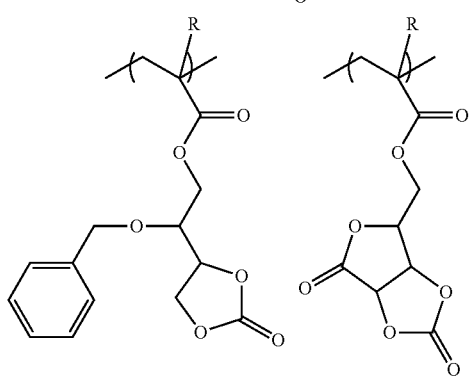

-continued

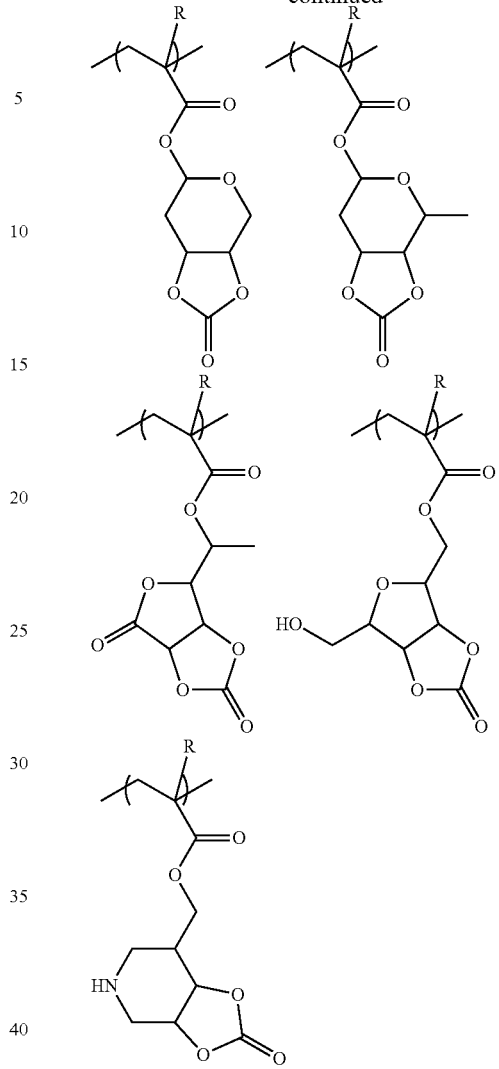

[1-10] Content of each Repeating Unit

The content of the repeating units (c0) and (c1) in the polymer (C) is preferably 10 mol % or more, and more preferably 50 mol % or more, based on the total amount (=100 mol %) of the repeating units included in the polymer (C). It is especially preferable that the content of the repeating units (c0) and (c1) is within the above range in the view point of ensuring water repellency during liquid immersion lithography, and improving affinity to a developer during development.

The content of the repeating unit (c3) or (c4) in the polymer (C) is preferably 20 to 90 mol %, more preferably 20 to 80 mol %, and particularly preferably 20 to 70 mol %. It is especially effective that the content of the repeating unit (c3) or (c4) is within the above range in the view point of ensuring water repellency during liquid immersion lithography, and improving affinity to a developer during development.

The content of the repeating unit (c5) in the polymer (C) is preferably 80 mol % or less, more preferably 20 to 80 mol %, and particularly preferably 30 to 70 mol %. It is especially effective that the content of the repeating unit (c5) is within the above range in the viewpoint of improving the shape of the resist pattern obtained by development.

The content of the repeating unit (c6) in the polymer (C) is normally 50 mol % or less, preferably 5 to 30 mol %, and more preferably 5 to 20 mol %. It is especially effective that the content of the repeating unit (c6) is within the above range in view of ensuring water repellency during liquid immersion lithography, and improving affinity to a developer during development.

The content of the repeating unit (c7) in the polymer (C) is normally 50 mol % or less, preferably 5 to 30 mol %, and more preferably 5 to 20 mol %. It is especially effective that the content of the repeating unit (c7) is within the above range in view of ensuring the polymer (C) exhibits water repellency during liquid immersion lithography, and improving affinity to a developer during development.

[1-11] Property Value

The Mw of the polymer (C) is preferably 1000 to 50,000, more preferably 1000 to 40,000, and particularly preferably 1000 to 30,000. If the Mw of the polymer (C) is 1000 or more, a resist film that exhibits a sufficient receding contact angle can be obtained. If the Mw of the polymer (C) is 50,000 or less, the resist film exhibits excellent developability. The ratio (Mw/Mn) of the Mw to the polystyrene-reduced number average molecular weight (hereinafter referred to as "Mn") determined by GPC of the polymer (C) is preferably 1 to 5, and more preferably 1 to 4.

It is preferable that the polymer (C) have an impurity (e.g., halogens and metals) content as low as possible. The sensitivity, the resolution, the process stability, the pattern shape, and the like of the resist film can be further improved by reducing the impurity content in the polymer (C).

[1-12] Production of Polymer (C)

The polymer (C) may be produced by using a polymerizable compound shown by the following general formula (Mc1) that includes a fluorine atom (hereinafter may be referred to as "compound (Mc1)") as a monomer content and polymerizing it in an appropriate solvent in the presence of a radical initiator and an optional chain transfer agent. Examples of the radical initiator include hydroperoxides, dialkyl peroxides, diacyl peroxides, azo compounds, and the like.

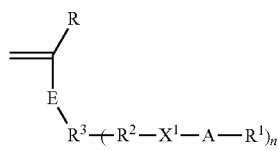

(Mc1)

Examples of the solvent include alkanes such as n-pentane and n-hexane; cycloalkanes such as cyclohexane and cycloheptane; aromatic hydrocarbons such as benzene and toluene; halogenated hydrocarbons such as chlorobutane and bromohexane; saturated carboxylates such as ethyl acetate; ethers such as tetrahydrofuran; and the like. These solvents may be used either individually or in combination. The reaction temperature is normally 40 to 120° C., and preferably 50 to 90° C. The reaction time is normally 1 to 48 hours, and preferably 1 to 24 hours.

[1-12-1] Compound (Mc1)

Examples of the compound (Mc1) include compounds shown by the following formulas (Mc2-1) and (Mc2-2).

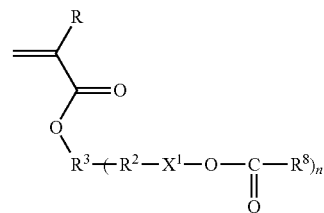

(Mc2-1)

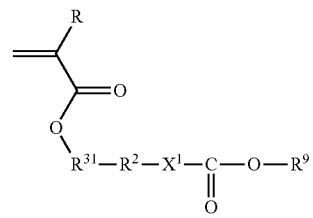

(Mc2-2)

Specific examples of the compound shown by the general formula (Mc2-1) include compounds shown by the following general formulas.

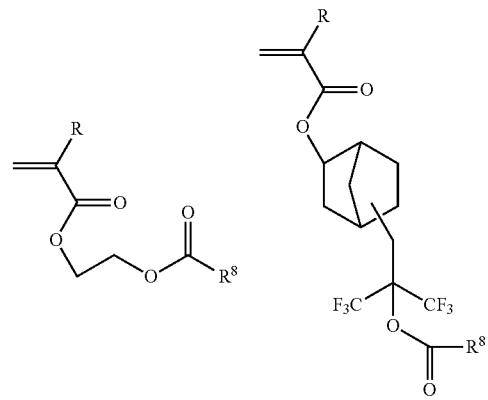

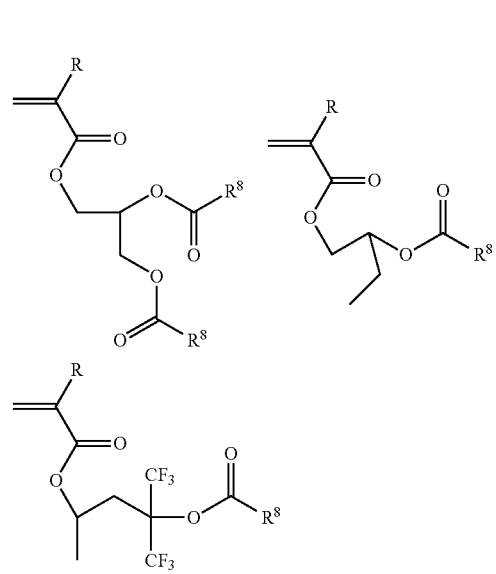

-continued

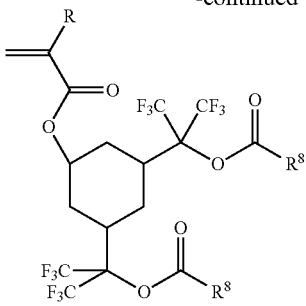

The compound shown by the general formula (Mc2-1) may be obtained by reacting a compound shown by the following general formula (9) with a compound shown by the following general formula (10), for example.

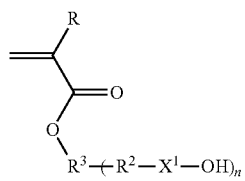

(9)

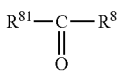

(10)

wherein $R^{81}$ represents a hydroxyl group, a halogen atom, or —O—CO—$R^8$.

The compound shown by the general formula (Mc2-2) may be obtained by reacting a compound shown by the following general formula (11) with compounds shown by the following general formulas (12-1) to (12-3), for example.

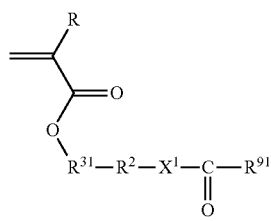

(11)

wherein $R^{91}$ represents a hydroxyl group or a halogen atom.

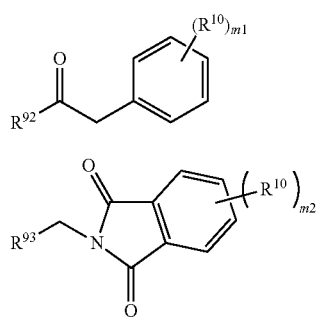

(12-1)

(12-2)

-continued

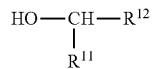

(12-3)

wherein $R^{92}$ represents a halogen atom (preferably Cl), and $R^{93}$ represents a halogen atom (preferably Br).

The compound shown by the general formula (Mc2-2) may also be obtained by reacting a compound shown by the following general formula (13) with a compound shown by the following general formula (14).

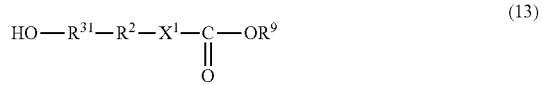

(13)

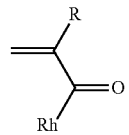

(14)

wherein Rh represents a hydroxyl group or a halogen atom.

It is not especially restricted for producing the compound shown by the following general formula (13). However, the compound shown by the following general formula (13) may be obtained by the method disclosed in paragraphs [0112] to [0123] of Japanese Patent Application Publication (KOKAI) No. 2009-19199, for example.

Specific examples of a monomer that produces the polymer (C) that includes the functional group (x) include compounds shown by the following formulas.

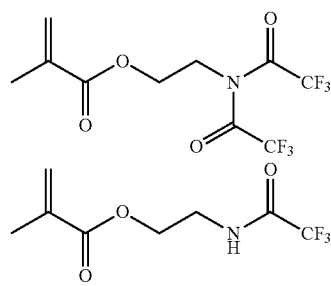

[2] Radiation-sensitive Resin Composition

A radiation-sensitive resin composition according to one embodiment of the invention includes the polymer (C), the polymer (A), and an acid generator (B) as essential components, and includes an optional component depending on the objective.

Since the radiation-sensitive resin composition according to the embodiment of the invention includes the polymer (C) as an essential component, it is unnecessary to form an upper-layer film that isolates a photoresist film from an immersion medium. Therefore, the radiation-sensitive resin composition may suitably be used for liquid immersion lithography.

The polymer (C) has a fluorine atom content higher than that of the polymer (A). Therefore, by using such a polymer, the polymer (C) is unevenly distributed near the surface of the resist film, and the water repellency of the resist film is improved. It is preferable that the polymer (C) have a fluorine atom content higher than that of the polymer (A) by 1 mass % or more, more preferably 5 mass % or more, and particularly preferably 5 to 45 mass %.

It is preferable that the radiation-sensitive resin composition include the polymer (C) in an amount of 0.1 to 20 parts by mass based on 100 parts by mass of the polymer (A) in view of ensuring water repellency of the resist film, and the resist pattern obtained by development. If the amount of the polymer (C) is too small, the effect of the polymer (C) may be insufficient. If the amount of the polymer (C) is too large, patterning may be significantly impaired (e.g., a T-top shape or occurrence of scum).

[2-1] Polymer (A)

The polymer (A) includes an acid-labile group. The polymer (A) that includes an acid-labile group is insoluble or scarcely soluble in an alkali before an effect of acids, but becomes alkali-soluble upon dissociation of the acid-labile group due to an acid. The polymer (A) is a component that serves as a base resin in the radiation-sensitive resin composition according to the embodiment of the invention.

The expression "insoluble or scarcely soluble in an alkali" means that a film (thickness: 100 nm) that is formed only of the polymer (A) has a thickness equal to or more than 50% of the initial thickness when developed under alkaline development conditions employed when forming a resist pattern using a resist film formed of a radiation-sensitive resin composition that includes the polymer (A).

[2-1-1] Fluorine Atom Content

The fluorine atom content in the polymer (A) is preferably less than 5 mass %, more preferably 0 to 4.9 mass %, and particularly preferably 0 to 4 mass % based on the total mass % of the polymer (A) of 100 mass %. If the fluorine atom content in the polymer (A) is within the above range, the surface of a resist film formed using a radiation-sensitive resin composition that includes the polymers (C) and (A) exhibits improved water repellency. This makes it unnecessary to form an upper-layer film for liquid immersion lithography.

The structure of the polymer (A) is not particularly limited as long as the polymer (A) has the above properties. It is preferable that the polymer (A) include a repeating unit shown by the general formula (c4) (hereinafter referred to as "repeating unit (a1)") and a repeating unit shown by the general formula (c7) (hereinafter referred to as "repeating unit (a2)").

[2-1-2] Repeating Unit (a1)

The content of the repeating unit (a1) in the polymer (A) is preferably 15 to 85 mol %, more preferably 25 to 75 mol %, and particularly preferably 35 to 60 mol %. If the content of the repeating unit (a1) is 15 mol % or more, the contrast after dissolution and the pattern shape are improved. If the content of the repeating unit (a1) is 85 mol % or less, the resulting pattern does not peel off due to sufficient adhesion to the substrate.

[2-1-3] Repeating Unit (a2)

The content of the repeating unit (a2) in the polymer (A) is preferably 5 to 75 mol %, more preferably 15 to 65 mol %, and particularly preferably 25 to 55 mol %. If the content of the repeating unit (a2) is 5 mol % or more, the resulting pattern does not peel off due to sufficient adhesion to the substrate. If the content of the repeating unit (a2) exceeds 75 mol %, the pattern shape may deteriorate due to a decrease in contrast after dissolution.

[2-1-4] Additional Repeating Unit

The polymer (A) may include an additional repeating unit other than the repeating units (a1) and (a2). Examples of a polymerizable unsaturated monomer that produces such an additional repeating unit include the monomers disclosed in paragraphs [0065] to [0085] of WO2007/116664A.

A repeating unit derived from 2-hydroxyethyl (meth)acrylate, 2-hydroxypropyl (meth)acrylate, or 3-hydroxypropyl (meth)acrylate, a repeating unit derived from the compound shown by the general formula (Mc6-1) mentioned above in connection with the repeating unit (c6), and a repeating unit shown by the following general formula (o1) are preferable as the additional repeating unit.

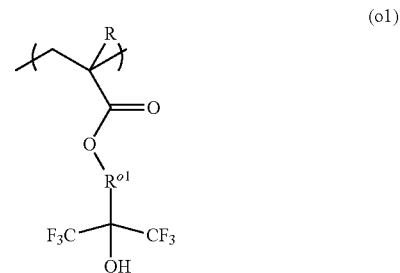

(o1)

wherein $R^{o1}$ represents a divalent linking group.

The divalent linking group represented by $R^{o1}$ in the general formula (o1) is preferably a divalent hydrocarbon group, and more preferably a chain-like or cyclic hydrocarbon group. The divalent linking group may be an alkylene glycol group or an alkylene ester group.

Examples of a preferable divalent linking group represented by $R^{o1}$ include saturated chain-like hydrocarbon groups such as a methylene group, an ethylene group, a propylene group (e.g., 1,3-propylene group or 1,2-propylene group), a tetramethylene group, a pentamethylene group, a hexamethylene group, a heptamethylene group, an octamethylene group, a nonamethylene group, a decamethylene group, an undecamethylene group, a dodecamethylene group, a tridecamethylene group, a tetradecamethylene group, a pentadecamethylene group, a hexadecamethylene group, a heptadecamethylene group, an octadecamethylene group, a nonadecamethylene group, an icosylene group, a 1-methyl-1,3-propylene group, a 2-methyl-1,3-propylene group, a 2-methyl-1,2-propylene group, a 1-methyl-1,4-butylene group, a 2-methyl-1,4-butylene group, a methylidene group, an ethylidene group, a propylidene group, and a 2-propylidene group; monocyclic hydrocarbon groups such as cycloalkylene groups having 3 to 10 carbon atoms, such as a cyclobutylene group (e.g., 1,3-cyclobutylene group), a cyclopentylene group (e.g., 1,3-cyclopentylene group), a cyclohexylene group (e.g. 1,4-cyclohexylene group), and a cyclooctylene group (e.g., 1,5-cyclooctylene group); bridged cyclic hydrocarbon groups such as cyclic hydrocarbon groups including 2 to 4 rings and having 4 to 30 carbon atoms, such as a norbornylene group (e.g., 1,4-norbornylene group or 2,5-norbornylene group) and an admantylene group (e.g., 1,5-admantylene group or 2,6-admantylene group); and the like.

When $R^{o1}$ represents a divalent alicyclic hydrocarbon group, it is preferable that an alkylene group having 1 to 4 carbon atoms as a spacer be inserted between the bis(trifluoromethyl)hydroxymethyl group and the alicyclic hydrocarbon group.

The polystyrene-reduced weight average molecular weight (Mw) of the polymer (A) determined by gel permeation chromatography (GPC) is normally 3000 to 300,000, preferably 4000 to 200,000, and still more preferably 4000 to 100,000. If the Mw of the polymer (A) is 3000 or more, the resulting resist exhibits excellent heat resistance. If the Mw of the polymer (A) is 300,000 or less, the resulting resist exhibits excellent developability.

It is preferable that the polymer (A) have an impurity (e.g., halogens and metals) content as low as possible so that the sensitivity, the resolution, the process stability, the pattern shape, and the like of the resist are improved. The polymer (A) may be purified by chemical purification (e.g., washing with water or liquid-liquid extraction), or a combination of chemical purification and physical purification (e.g., ultrafiltration or centrifugation), for example. The radiation-sensitive resin composition of the embodiment of the invention may include only one type of the polymer (A), or may include two or more types of the polymer (A).

[2-2] Acid Generator (B)

The acid generator (photoacid generator) (B) generates an acid upon exposure to radiation (hereinafter referred to as "exposure"). The acid-labile group included in the polymer (A) dissociates due to an acid generated by the acid generator (B) upon exposure, so that the polymer (A) become alkali-soluble. As a result, the exposed area of the resist film becomes readily soluble in an alkaline developer, so that a positive-tone resist pattern can be formed. Examples of the acid generator (B) include the compounds disclosed in paragraphs [0080] to [0113] of Japanese Patent Application Publication (KOKAI) No. 2009-134088, and the like.

Specific examples of the acid generator (B) include diphenyliodonium trifluoromethanesulfonate and the like. These acid generators (B) may be used either individually or in combination.

The acid generator (B) is preferably used in an amount of 0.1 to 30 parts by mass, more preferably 2 to 27 parts by mass, and particularly preferably 5 to 25 parts by mass, based on 100 parts by mass of the polymer (A). If the amount of the acid generator (B) is 0.1 parts by mass or more, the resist film exhibits excellent sensitivity and resolution. If the amount of the acid generator (B) is 30 parts by mass or less, excellent applicability and an excellent pattern shape are obtained as a resin film

[2-3] Acid Diffusion Controller (D)

The radiation-sensitive resin composition of the embodiment of the invention may optionally include (D) an acid diffusion controller.

[2-3-1] Nitrogen-containing Organic Compound

Examples of the acid diffusion controller include a compound shown by the following general formula (D1) (hereinafter referred to as "nitrogen-containing compound (I)"), a compound that includes two nitrogen atoms in the molecule (hereinafter referred to as "nitrogen-containing compound (II)"), a compound that includes three or more nitrogen atoms in the molecule (hereinafter referred to as "nitrogen-containing compound (III)"), an amide group-containing compound, a urea compound, a nitrogen-containing heterocyclic compound, and the like. The acid diffusion controller improves the pattern shape and the dimensional accuracy of the resist.

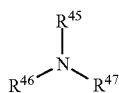

(D1)

wherein $R^{45}$ to $R^{47}$ independently represent a hydrogen atom, a substituted or unsubstituted linear, branched, or cyclic alkyl group, an aryl group, or an aralkyl group.

Examples of the nitrogen-containing compound (I) include monoalkylamines such as n-hexylamine; dialkylamines such as di-n-butylamine; trialkylamines such as triethylamine; aromatic amines such as aniline; and the like. Examples of the nitrogen-containing compound (II) include ethylenediamine and the like. Examples of the nitrogen-containing compound (III) include polyethylenimine and the like.

Examples of the amide group-containing compound include formamide and the like. Examples of the urea compound include urea and the like. Examples of the nitrogen-containing heterocyclic compound include pyridines such as pyridine, pyrazine, and the like.

A nitrogen-containing organic compound that includes an acid-labile group may also be used as the nitrogen-containing organic compound. Examples of the nitrogen-containing organic compound that includes an acid-labile group include N-(t-butoxycarbonyl)piperidine, N-(t-butoxycarbonyl)imidazole, N-(t-butoxycarbonyl)benzimidazole, N-(t-butoxycarbonyl)-2-phenylbenzimidazole, N-(t-butoxycarbonyl)di-n-octylamine, N-(t-butoxycarbonyl)diethanolamine, N-(t-butoxycarbonyl)dicyclohexylamine, N-(t-butoxycarbonyl) diphenylamine, tert-butyl 4-hydroxy-1-piperidinecarboxylate, and the like.

[2-3-2] Photo Degradable Acid Diffusion Controller

A compound shown by the following general formula (D2) may also be used as the acid diffusion controller.

wherein $X^+$ represents a cation shown by the following general formula (15-1) or (15-2), and $Z^-$ represents $OH^-$, an anion shown by the following general formula (16-1) "$R^{D1}$—$COO^-$", an anion shown by the following general formula (16-2) "$R^{D1}$—$SO_3^-$", or an anion shown by the following general formula (16-3) "$R^{D1}$—$N^-SO_2$—$R^{D21}$" (wherein $R^{D1}$ represents a substituted or unsubstituted alkyl group, a substituted or unsubstituted monovalent alicyclic hydrocarbon group, or a substituted or unsubstituted aryl group, and $R^{D21}$ represents an alkyl group in which some or all of the hydrogen atoms are substituted with a fluorine atom, or a monovalent alicyclic hydrocarbon group).

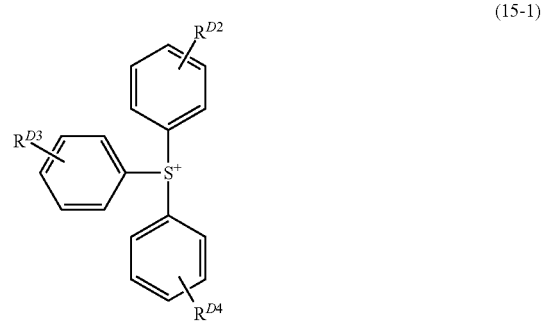

(15-1)

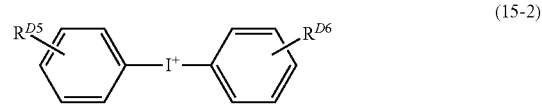

(15-2)

wherein $R^{D2}$ to $R^{D4}$ independently represent a hydrogen atom, an alkyl group, an alkoxy group, a hydroxyl group, or a halogen atom, and $R^{D5}$ and $R^{D6}$ independently represent a hydrogen atom, an alkyl group, an alkoxy group, a hydroxyl group, or a halogen atom.

The above compound is used as an acid diffusion controller that loses acid diffusion controllability upon decomposition due to exposure (hereinafter may be referred to as "photodegradable acid diffusion controller"). The above compound allows diffusion of an acid in the exposed area, but controls diffusion of an acid in the unexposed area, so that the contrast between the exposed area and the unexposed area is improved (i.e., the boundary between the exposed area and the unexposed area becomes distinct). This is effective for improving the LWR and the MEEF of the radiation-sensitive resin composition.

[2-3-2a] $X^+$ $X^+$ in the general formula (D2) represents a cation shown by the general formula (15-1) or (15-2). $R^{D2}$ to $R^{D4}$ in the general formula (15-1) preferably represent a hydrogen atom, an alkyl group, an alkoxy group, or a halogen atom since the solubility of the compound in a developer decreases. $R^{D5}$ and $R^{D6}$ in the general formula (15-2) preferably represent a hydrogen atom, an alkyl group, or a halogen atom.

[2-3-2b] $Z^-$ $Z^-$ in the general formula (D2) represents an anion among the anions shown by $OH^-$ and the general formulas (16-1) to (16-3). $R^{D1}$ in the general formulas (16-1) to (16-3) preferably represents an alicyclic hydrocarbon group or an aryl group since the solubility of the compound in a developer decreases.

Examples of the substituted or unsubstituted alkyl group represented by $R^{D1}$ include an alkyl group that is substituted with one or more substituents such as a hydroxyalkyl group having 1 to 4 carbon atoms (e.g., hydroxymethyl group), an alkoxy group group having 1 to 4 carbon atoms (e.g., methoxy group), a cyano group, or a cyanoalkyl group having 2 to 5 carbon atoms (e.g., cyanomethyl group). Among these, a hydroxymethyl group, a cyano group, and a cyanomethyl group are preferable.

Examples of the substituted or unsubstituted alicyclic hydrocarbon group include a monovalent group derived from an alicyclic hydrocarbon such as a cycloalkane skeleton (e.g., hydroxycyclopentane, hydroxycyclohexane, or cyclohexanone) or a bridged alicyclic hydrocarbon skeleton (e.g., 1,7,7-trimethylbicyclo[2.2.1]heptan-2-one (camphor)). Among these, a group derived from 1,7,7-trimethylbicyclo[2.2.1]heptan-2-one is preferable.

Examples of the substituted or unsubstituted aryl group include a phenyl group, a benzyl group, a phenylethyl group, a phenylpropyl group, a phenylcyclohexyl group, and groups obtained by substituting these groups with a hydroxyl group, a cyano group, or the like. Among these, a phenyl group, a benzyl group, and a phenylcyclohexyl group are preferable.

$Z^-$ in the formula (D2) preferably represents the anion shown by the following formula (17-1) (i.e., an anion shown by the general formula (16-1) wherein $R^{D1}$ represents a phenyl group), the anion shown by the following formula (17-2) (i.e., an anion shown by the general formula (16-2) wherein $R^{D1}$ represents a group derived from 1,7,7-trimethylbicyclo[2.2.1]heptan-2-one), or the anion shown by the following formula (17-3) (i.e., an anion shown by the general formula (16-3) wherein $R^{D1}$ represents a butyl group, and $R^{D2}$ represents a trifluoromethyl group).

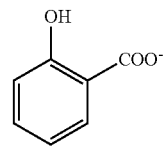

(17-1)

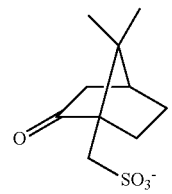

(17-2)

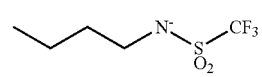

(17-3)

The photodegradable acid diffusion controller is shown by the formula (D2). Specifically, the photodegradable acid diffusion controller is a sulfonium salt compound or an iodonium salt compound that satisfies the above conditions.

Examples of the sulfonium salt compounds include triphenylsulfonium hydroxide, triphenylsulfonium salicylate, triphenylsulfonium 4-trifluoromethyl salicylate, diphenyl-4-hydroxyphenylsulfonium salicylate, triphenylsulfonium 10-camphorsulfonate, 44-butoxyphenyl diphenylsulfonium 10-camphorsulfonate, and the like. These sulfonium salt compounds may be used either individually or in combination.

Examples of the iodonium salt compound include bis(4-t-butylphenyl)iodonium hydroxide, bis(4-t-butylphenyl)iodonium salicylate, bis(4-t-butylphenyl)iodonium 4-trifluoromethyl salicylate, bis(4-t-butylphenyl)iodonium 10-camphorsulfonate, and the like. These iodonium salt compounds may be used either individually or in combination.

These acid diffusion controllers may be used either individually or in combination. The acid diffusion controller is preferably used in an amount of 10 parts by mass or less, and more preferably 5 parts by mass, based on 100 parts by mass of the polymer (A). If the amount of the acid diffusion controller is within the above range, the sensitivity of the resulting resist film is improved.

[2-4] Additional Component

The radiation-sensitive resin composition of the embodiment of the invention may optionally include various additives such as an alicyclic additive, a surfactant, a sensitizer, a halation inhibitor, an adhesion improver, a storage stability improver, and an anti-foaming agent other than the acid diffusion controllers.

[2-4-1] Alicyclic Additive

The alicyclic additive further improves the dry etching resistance, the pattern shape, adhesion to a substrate, and the like of the radiation-sensitive resin composition. Examples of the alicyclic additive include the components disclosed in paragraph [0094] of Japanese Patent Application Publication (KOKAI) No. 2009-235118. These alicyclic additives may be used either individually or in combination. The alicyclic additive is normally used in an amount of 50 parts by mass or less, and preferably 30 parts by mass or less, based on 100 parts by mass of the polymer (A).

[2-4-2] Surfactant

The surfactant improves the applicability, the developability, and the like of the radiation-sensitive resin composition. Examples of the surfactant include the components disclosed in paragraph [0095] of Japanese Patent Application Publication (KOKAI) No. 2009-235118. These surfactants may be used either individually or in combination. The surfactant is normally used in an amount of 2 parts by mass or less based on 100 parts by mass of the polymer (A).

[2-5] Preparation of Composition Solution

The radiation-sensitive resin composition of the embodiment of the invention is normally prepared as a composition solution by dissolving the components in a solvent so that the total solid content is 1 to 50 mass %, and preferably 3 to 25 mass %, and filtering the solution through a filter having a pore size of about 0.02 μm, for example.

Examples of the solvent used to prepare the composition solution include linear or branched ketones, cyclic ketones, propylene glycol monoalkyl ether acetates, alkyl 2-hydroxypropionates, alkyl 3-alkoxypropionates, and the like.

These solvents may be used either individually or in combination. Among these, linear or branched ketones, cyclic ketones, propylene glycol monoalkyl ether acetates, alkyl 2-hydroxypropionates, alkyl 3-alkoxypropionates, and the like are preferable.

[3] Method for Forming Resist Pattern

A method for forming a resist pattern according to the embodiment of the invention includes a film-forming step (1), an exposure step (2), and a development step (3) as indispensable steps.

[3-1] Film-forming Step (1)

The film-forming step (1) includes forming a resist film on a substrate using the radiation-sensitive resin composition according to one embodiment of the invention. For example, the radiation-sensitive resin composition according to the embodiment of the invention is applied to the substrate by spin coating, cast coating, roll coating, or the like to form a resist film.

A silicon wafer, an aluminum-coated wafer, or the like may be used as the substrate. The thickness of the resist film is preferably 0.01 to 5 μm, and more preferably 0.01 to 2 μm.

The resist film may be prebaked (PB) in order to volatilize the solvent from the resist film. The PB temperature is determined depending on the composition of the radiation-sensitive resin composition, but is preferably 30 to 200° C., and more preferably 50 to 150° C.

In order to maximize the potential of the radiation-sensitive resin composition, an organic or inorganic antireflective film may be formed on the substrate (see Japanese Examined Patent Publication (KOKOKU) No. 6-12452, for example). A protective film may be formed on the resist film in order to prevent an adverse effect of basic impurities and the like contained in the environmental atmosphere (see Japanese Patent Application Publication (KOKAI) No. 5-188598, for example). These techniques may be used in combination.

[3-2] Exposure Step (2)

The exposure step (2) includes exposing the resist film by applying radiation to the resist film via a mask pattern. When radiation is applied to the resist film, an acid is generated from the acid generator (B) in the exposed area, and the acid-labile group included in the polymer (A) dissociates due to the acid, so that the polymer (A) become alkali-soluble.

Radiation used for exposure may be appropriately selected from visible rays, ultraviolet rays, deep ultraviolet rays, X-rays, charged particle rays, and the like depending on the type of the acid generator (B). Among these, it is preferable to apply ArF excimer laser light (wavelength: 193 nm) or KrF excimer laser light (wavelength: 248 nm).

It is preferable to perform post-exposure bake (PEB) after exposure. The acid-labile group included in the resin (A) dissociates smoothly due to PEB. The PEB temperature is determined depending on the composition of the radiation-sensitive resin composition, but is normally 30 to 200° C., and preferably 50 to 170° C.

It is preferable that the exposure step (2) include exposing the resist film formed by the film-forming step (1) via an immersion liquid provided over the resist film (liquid immersion lithography).

Purified water, a long-chain or cyclic aliphatic compound, or the like may be used as the immersion liquid.

In order to prevent outflow of the acid generator and the like from the resist film during liquid immersion lithography, an upper-layer film (protective film) may be formed on the resist film (see Japanese Patent Application Publication (KOKAI) No. 2005-352384, for example). Note that the upper-layer film need not necessarily be formed when forming a resist film using the radiation-sensitive resin composition according to the embodiment of the invention. It is possible to improve the throughput when it is unnecessary to form an upper-layer film

[3-3] Development Step (3)

The development step (3) includes developing the exposed resist film to form a resist pattern. Therefore, the polymer (A) that has become alkali-soluble due to the exposure step (2) is dissolved in and removed by the alkaline developer to obtain a positive-tone resist pattern. The resist film is normally rinsed with water after the development step (3), and then dried.

A commonly used developer, such as an alkaline aqueous solution prepared by dissolving at least one alkaline compound (e.g., sodium hydroxide, potassium hydroxide, ammonia, ethylamine, tetramethylammonium hydroxide, pyrrole, or piperidine) in water is preferable as the developer.

The concentration of the alkaline aqueous solution is normally 10 mass % or less. If the concentration of the aqueous alkaline solution exceeds 10 mass %, the unexposed area may be dissolved in the developer.

An organic solvent or a surfactant may be added to the developer consisting of the alkaline aqueous solution. Examples of the organic solvent include linear, branched, or cyclic ketones such as acetone, methyl ethyl ketone, cyclopentanone, and cyclohexanone, alcohols such as methanol, ethanol, cyclopentanol, and cyclohexanol, ethers such as tetrahydrofuran and dioxane, esters such as ethyl acetate and n-butyl acetate, aromatic hydrocarbons such as toluene and xylene, phenol, acetonylacetone, dimethylformamide, and the like.

These organic solvents may be used either individually or in combination. The organic solvent is preferably used in an amount of 100 vol % or less based on the amount of the alkaline aqueous solution. If the amount of the organic solvent is 100 vol % or less, the exposed area rarely remains undeveloped due to an improvement in developability.

EXAMPLES

The invention is further described below by way of examples. Note that the invention is not limited to the following examples. In the examples and comparative examples, the units "parts" and "%" respectively refer to "parts by mol" and "mol %" unless otherwise specified. The following property value measuring methods and property evaluation methods were employed.

Measurement of Receding Contact Angle

A film was formed on a substrate (wafer) using the radiation-sensitive resin composition. The receding contact angle of the film was measured by the following method at a temperature of 23° C. (room temperature) and a humidity of 45% under atmospheric pressure using a contact angle meter ("DSA-10" manufactured by KRUS).

The position of the wafer stage was adjusted, and the wafer was placed on the stage. After injecting water into the needle, the position of the needle was finely adjusted. Water was then discharged from the needle to form a water droplet (25 μl) on the wafer, and the needle was withdrawn from the water droplet. The needle was then moved downward to the finely adjusted position. The water droplet was sucked via the needle for 90 seconds at a rate of 10 μl/min, and the contact angle was measured every second (90 times in total). The average value of twenty contact angles measured after the value became stable was calculated, and taken as the receding contact angle (°).

A film (thickness: 110 nm) was formed on an 8-inch silicon wafer using the radiation-sensitive resin composition, and soft-baked (SB) at 120° C. for 60 seconds, and the receding contact angle was then measured and taken as the receding contact angle after soft-bake (SB).

A film (thickness: 110 nm) was formed on an 8-inch silicon wafer using the radiation-sensitive resin composition, soft-baked (SB) at 120° C. for 60 seconds, developed for 10 seconds using a 2.38 mass % tetramethylammonium hydroxide aqueous solution by utilizing the GP nozzle of a developer ("Clean Track ACT 8" manufactured by Tokyo Electron Ltd.), rinsed with water for 15 seconds, and then dried. The receding contact angle was then measured and taken as the receding contact angle after development.

Development Defects

A film (thickness: 110 nm) of the radiation-sensitive resin composition was formed on a 12-inch silicon wafer on which an underlayer antireflective film was formed using an antireflective coating material ("ARC66" manufactured by Nissan Chemical Industries, Ltd.). The film was then soft-baked (SB) at 120° C. for 60 seconds. The film was exposed via a line-and-space (1L/1S) mask pattern (target width: 45 nm) using an ArF immersion scanner ("NSR S610C" manufactured by Nikon Corporation) (NA=1.3, ratio=0.800, Dipole).

The film was then subjected to PEB at 95° C. for 60 seconds. The film subjected to PEB was developed for 10 seconds using a 2.38 mass % tetramethylammonium hydroxide aqueous solution by utilizing the GP nozzle of the developer, rinsed with water for 15 seconds, and dried to form a positive-tone resist pattern. A dose at which a line-and-space pattern having a width of 45 nm was formed was determined to be an optimum dose. A line-and-space pattern having a width of 45 nm was formed over the entire wafer at the optimum dose to obtain a defect inspection wafer. A scanning electron microscope (1) ("CC-4000" manufactured by Hitachi High-Technologies Corporation) was used for the measurement.

The number of defects on the defect inspection wafer was measured using a bright field optical inspection instrument ("KLA2810" manufactured by KLA-Tencor). Defects measured using the bright field optical inspection instrument were classified into a defect due to the resist and a defect due to foreign matter. A case where the number of defects due to the resist film was less than 100 per wafer was evaluated as "Acceptable", a case where the number of defects due to the resist film was 100 to 500 per wafer was evaluated as "Fair", and a case where the number of defects due to the resist film was more than 500 per wafer was evaluated as "Unacceptable".

Cross-sectional Shape of Pattern

A film (thickness: 110 nm) of the radiation-sensitive resin composition was formed on a 12-inch silicon wafer on which the underlayer antireflective film was formed, soft-baked (SB) at 120° C. for 60 seconds, and exposed via a line-and-space (1L/1S) mask pattern (target width: 45 nm) using the ArF immersion scanner (NA=1.3, ratio=0.800, Dipole). The film was then subjected to PEB at 95° C. for 60 seconds, developed, rinsed with water, and dried in the same manner as described above to form a positive-tone resist pattern.

The cross-sectional shape of the pattern was observed using a scanning electron microscope (2) ("S-4800" manufactured by Hitachi High-Technologies Corporation), and the line width Lb in an intermediate area of the film and the line width La at the surface of the film were measured. Then, the formula: (La−Lb)/Lb is calculated. A case where 0.90< (La−Lb) was evaluated as "T-top", and a case where (La−Lb)<1.1 was evaluated as "Top round". A case where 0.90≤(La−Lb)≤1.1 was evaluated as "Acceptable". A case where the exposed area remained undissolved was evaluated as "Scum".

Mask Error Factor (MEEF)

A film (thickness: 110 nm) of the radiation-sensitive resin composition was formed on a 12-inch silicon wafer on which the underlayer antireflective film was formed, soft-baked (SB) at 120° C. for 60 seconds, and exposed via a line-and-space (LS) mask pattern (target pitch: 90 nm) using the ArF immersion scanner (NA=1.3, ratio=0.800, Dipole).

The film was then subjected to PEB at 95° C. for 60 seconds, developed, rinsed with water, and dried in the same manner as described above to form a positive-tone resist pattern. A dose at which a line-and-space pattern having a width of 45 nm was formed via a LS pattern (1L/1S) mask (target size: 45 nm) was determined to be an optimum dose (Eop).

An LS pattern (pitch: 90 nm) was formed at the optimum dose (Eop) using a mask pattern having a target line width of 40 nm, 42 nm, 44 nm, 46 nm, 48 nm, or 50 nm. A graph was drawn by plotting the target size (nm) (horizontal axis) and the line width (nm) of the resist film formed using each mask pattern (vertical axis), and the slope of the straight line of the graph was calculated to be the MEEF. The mask reproducibility was determined to be better as the MEEF (i.e., the slope of the straight line) was closer to 1. A case where 1.10≤MEEF<1.25 was evaluated as "Acceptable", a case where 1.25≤MEEF<1.50 was evaluated as "Fair", and a case where 1.50≤MEEF was evaluated as "Unacceptable". The results are shown below.

Example 48

2-(2,2,2-Trifluoroacetoxy)ethyl methacrylate (compound shown by the following formula (M-16)) was synthesized as described below.

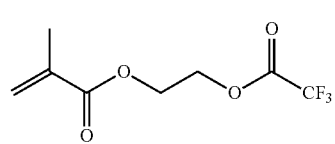

(M-16)

The inside of a reactor was sufficiently dried by vacuum heating, and the atmosphere inside the reactor was replaced with dry nitrogen. The reactor was charged with 130.14 g (1.0 mol) of 2-hydroxyethyl methacrylate and 500 ml of methyl isobutyl ketone (MIBK). After cooling the mixture to 0° C. in an ice bath, 231.03 g (1.1 mol) of trifluoroacetic anhydride was added to the mixture over 30 minutes with stirring. A solution prepared by dissolving 92.41 g (1.1 mol) of sodium hydrogencarbonate in 500 ml of water was then added to the mixture with sufficient stirring.

After separating the MIBK layer, the aqueous layer was extracted with MIBK to obtain extracted solution. The extract was combined with the MIBK layer. The mixture was washed with a saturated sodium chloride solution, and dried over sodium sulfate (desiccant). After removing sodium sulfate using a Buchner funnel, the organic solvent was evaporated. The residue was then distilled under reduced pressure (2 mmHg). 207.34 g of 2-(2,2,2-trifluoroacetoxy)ethyl methacrylate was thus obtained (yield: 92%).

The $^1$H-NMR data for 2-(2,2,2-trifluoroacetoxy)ethyl methacrylate thus obtained in the example is shown below.

$^1$H-NMR (CDCl$_3$) δ: 1.95 (s, 3H, C—CH$_3$), 4.45 (m, 3H, CH$_2$), 4.62 (m, 3H, CH$_2$), 5.62 (s, 1H, C=CH$_2$), 6.13 (s, 1H, C=CH$_2$).

Example 49

5,5,5-Trifluoro-4-(2,2,2-trifluoroacetoxy)-4-(trifluoromethyl)pentan-2-yl methacrylate (compound shown by the following formula (M-17)) was synthesized as described below.

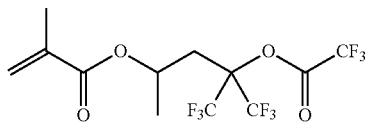

(M-17)

200 ml of 4-methyl-2-pentanone was added to 29.42 g (100 mmol) of 5,5,5-trifluoro-4-hydroxy-4-(trifluoromethyl)pentan-2-yl methacrylate at 0° C. in a nitrogen atmosphere. 23.10 g (100 mmol) of trifluoroacetic anhydride was added dropwise to the mixture over 30 minutes. After stirring the mixture at room temperature for 2 hours, a sodium hydrogencarbonate aqueous solution was added to the mixture to terminate the reaction.

The reaction mixture was extracted three times with 4-methyl-2-pentanone. The organic layer was washed once with water, washed once with a saturated sodium chloride aqueous solution, and dried over anhydrous sodium sulfate. After evaporating the solvent under reduced pressure, the product was purified by column chromatography to obtain 17.29 g of 5,5,5-trifluoro-4-(2,2,2-trifluoroacetoxy)-4-(trifluoromethyl)pentan-2-yl methacrylate (yield: 44%).

The $^1$H-NMR data for 5,5,5-trifluoro-4-(2,2,2-trifluoroacetoxy)-4-(trifluoromethyl)pentan-2-yl methacrylate thus obtained in the example is shown below.

$^1$H-NMR (CDCl$_3$) δ: 1.35 (d, 3H, CH$_3$), 1.92 (s, 3H, CH$_3$), 2.70-2.90 (m, 2H, CH$_2$), 5.11-5.22 (m, 1H, O—CH), 5.47 (s, 1H, C=CH$_2$), 6.10 (s, 1H, C=CH$_2$).

Example 50

Benzyl 2-(methacryloyloxy)ethylsuccinate (compound shown by the following formula (M-18)) was synthesized as described below.

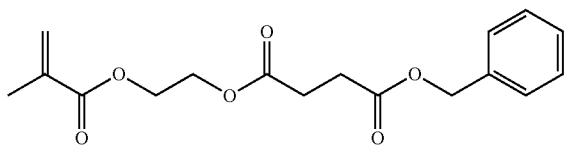

(M-18)

400 ml of dehydrated methylene chloride and 11.13 g (110 mmol) of triethylamine were added to 11.51 g (50 mmol) of 4-[(2-methacryloyloxy)ethoxy]-4-oxobutyric acid at 0° C. in a nitrogen atmosphere. 17.06 g (100 mmol) of benzyl chloroformate was added dropwise to the mixture over 10 minutes. The mixture was stirred at room temperature for 2 hours. After confirming disappearance of the raw materials by thin-layer chromatography (TLC), the reaction was terminated by adding a sodium hydrogencarbonate aqueous solution.

The reaction mixture was extracted three times with ethyl acetate. The organic layer was washed once with water, washed once with a saturated sodium chloride aqueous solution, and dried over anhydrous sodium sulfate. After evaporating the solvent under reduced pressure, the product was purified by column chromatography to obtain 11.21 g of benzyl 2-(methacryloyloxy)ethylsuccinate (yield: 70%).

The $^1$H-NMR data for 1-benzyl 2-[2-(methacryloyloxy)ethyl]cyclohexane-1,2-dicarboxylate thus obtained in the example is shown below.

$^1$H-NMR (CDCl$_3$) δ: 1.94 (s, 3H, C—CH$_3$), 2.55-2.71 (m, 4H, C(=O)CH$_2$), 4.26-4.45 (m, 4H, O—CH$_2$), 5.12-5.28 (m, 2H, Ar—CH$_2$), 5.59 (s, 1H, C=CH$_2$), 6.12 (s, 1H, C=CH$_2$), 7.28-7.49 (m, 5H, Ar).

Example 51

1-Benzyl 2-[2-(methacryloyloxy)ethyl]cyclohexane-1,2-dicarboxylate (compound shown by the following formula (M-19)) was synthesized as described below.

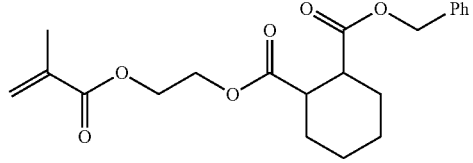

(M-19)

400 ml of dehydrated methylene chloride and 11.13 g (110 mmol) of triethylamine were added to 28.43 g (100 mmol) of 2-{[2-(methacryloyloxy)ethoxy]carbonyl}cyclohexanecarboxylic acid at 0° C. in a nitrogen atmosphere. 17.06 g (100 mmol) of benzyl chloroformate was added dropwise to the mixture over 10 minutes. The mixture was stirred at room temperature for 2 hours. After confirming disappearance of the raw materials by thin-layer chromatography (TLC), the reaction was terminated by adding a sodium hydrogencarbonate aqueous solution.

The reaction mixture was extracted three times with ethyl acetate. The organic layer was washed once with water, washed once with a saturated sodium chloride aqueous solution, and dried over anhydrous sodium sulfate. After evaporating the solvent under reduced pressure, the product was purified by column chromatography to obtain 26.66 g of 1-benzyl 2-[2-(methacryloyloxy)ethyl]cyclohexane-1,2-dicarboxylate (yield: 71%).

The $^1$H-NMR data for 1-benzyl 2-[2-(methacryloyloxy)ethyl]cyclohexane-1,2-dicarboxylate thus obtained is shown below.

$^1$H-NMR (CDCl$_3$) δ: 1.31-2.26 (m, 8H, CH$_2$), 1.92 (s, 3H, CH$_3$), 2.87-2.91 (m, 2H, CH), 4.18-4.42 (m, 4H, O—CH$_2$), 5.17-5.30 (m, 2H, Ar—CH$_2$), 5.59 (s, 1H, C=CH$_2$), 6.11 (s, 1H, C=CH$_2$), 7.29-7.51 (m, 5H, Ar).

Example 52

(1,3-Dioxoisoindolin-2-yl)methyl 2-(methacryloyloxy)ethylsuccinate (compound shown by the following formula (M-20)) was synthesized as described below.

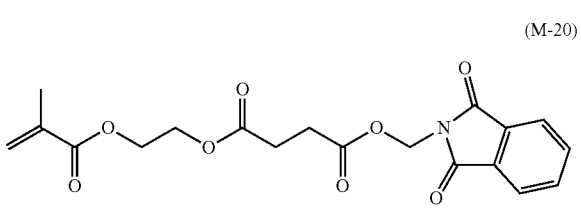 [SMILES: C=C(C)C(=O)OCCOC(=O)CCC(=O)OCN1C(=O)c2ccccc2C1=O]

(M-20)

The inside of a reactor was sufficiently dried by vacuum heating, and the atmosphere inside the reactor was replaced with dry nitrogen. The reactor was charged with 11.51 g (0.05 mol) of 4-[(2-methacryloyloxy)ethoxy]-4-oxobutyric acid, 6.07 g (0.06 mol) of triethylamine, and 150 ml of dimethylformamide (DMF). After heating the mixture to 65° C. on an oil bath, a solution prepared by dissolving 12.00 g (0.05 mol) of N-(bromomethyl)phthalimide in 100 ml of DMF was added to the mixture over 15 minutes with stirring.

After stirring the mixture for 1 hour, DMF was evaporated using a rotary evaporator, and the residue was extracted with ethyl acetate to obtain an extract. The extract was washed three times with water, washed with a saturated sodium hydrogencarbonate aqueous solution and then with a saturated sodium chloride solution, and dried over sodium sulfate (desiccant). After removing sodium sulfate using a Buchner funnel, the organic solvent was evaporated. 13.95 g of (1,3-dioxoisoindolin-2-yl)methyl 2-(methacryloyloxy)ethylsuccinate was thus obtained (yield: 72%).

The $^1$H-NMR data for (1,3-dioxoisoindolin-2-yl)methyl 2-(methacryloyloxy)ethylsuccinate thus obtained in the example is shown below.

$^1$H-NMR (CDCl$_3$) δ: 1.94 (s, 3H, C—CH3), 2.57-2.74 (m, 4H, C(=O)CH$_2$), 4.26-4.43 (m, 4H, O—CH$_2$), 5.59 (s, 1H, C=CH$_2$), 5.66-5.78 (m, 2H, CH$_2$—N), 6.12 (s, 1H, C=CH$_2$), 7.71-7.83 (m, 2H, Ar), 7.84-7.98 (m, 2H, Ar).

Example 53

Benzyl 2,2-difluoro-3-(methacryloyloxy)pentanoate (compound shown by the following formula (M-21)) was synthesized as described below.

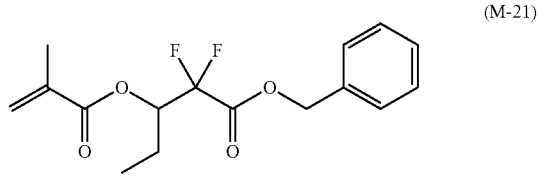 [SMILES: C=C(C)C(=O)OC(CC)C(F)(F)C(=O)OCc1ccccc1]

(M-21)

The inside of a reactor was sufficiently dried by vacuum heating, and the atmosphere inside the reactor was replaced with dry nitrogen. The reactor was charged with 25.54 g (0.1 mol) of 2,2-difluoro-3-(methacryloyloxy)pentanoic acid, 11.13 g (0.11 mol) of triethylamine, and 250 ml of methylene chloride. After cooling the mixture to 0° C. on an ice bath, 17.06 g (0.1 mol) of benzyl chloroformate was added to the mixture over 10 minutes with stirring. After increasing the temperature of the reactor to room temperature, the mixture was stirred for 2 hours. 300 g of a saturated sodium hydrogencarbonate aqueous solution was then added to the mixture while sufficiently stirring the mixture.

After separating the methylene chloride layer, the aqueous layer was extracted with methylene chloride to obtain an extract. The extract was combined with the methylene chloride layer. The mixture was washed with a saturated sodium chloride solution, and dried over sodium sulfate (desiccant). After removing sodium sulfate using a Buchner funnel, the organic solvent was evaporated. The residue was purified by silica gel column chromatography. 23.14 g of benzyl 2,2-difluoro-3-(methacryloyloxy)pentanoate was thus obtained (yield: 74%).

The $^1$H-NMR data for benzyl 2,2-difluoro-3-(methacryloyloxy)pentanoate thus obtained in the example is shown below.

$^1$H-NMR (CDCl$_3$) δ: 0.95 (t, 3H, CH$_2$—CH$_3$), 1.75-1.89 (m, 2H, CH$_2$—CH$_3$), 1.87 (s, 3H, CH$_3$—C), 5.24 (s, 2H, Ph—CH$_2$), 5.34-5.39 (m, 1H, CH—CF$_2$), 5.55 (s, 1H, C=CH$_2$), 6.06 (s, 1H, C=CH$_2$), 7.33-7.42 (m, 5H, Ar).

Example 54

Benzyl 2,2-difluoro-3-(methacryloyloxy)pentanoate (compound shown by the formula (M-21)) was synthesized as described below.

1.60 g (14 mmol) of t-butoxypotassium was added to a solution prepared by dissolving 20.30 g (0.1 mol) of ethyl 2-bromo-2,2-difluoroacetate in 140 ml of benzyl alcohol and 1200 ml of hexane at 0° C. in a nitrogen atmosphere. The mixture was stirred at 0° C. for 1 hour. After confirming disappearance of the raw materials by thin-layer chromatography (TLC), the reaction was terminated by adding 120 ml of concentrated hydrochloric acid. The mixture was washed twice with water, washed twice with a saturated sodium chloride solution, and dried over anhydrous sodium sulfate. After evaporating the solvent under reduced pressure, the product was purified by column chromatography to obtain 15.37 g of benzyl 2-bromo-2,2-difluoroacetate shown by the following formula (yield: 58%).

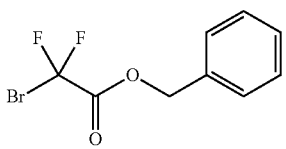 [SMILES: O=C(OCc1ccccc1)C(F)(F)Br]

100 ml of dehydrated THF was added to 3.79 g (58.0 mmol) of activated zinc in a nitrogen atmosphere. The mixture was heated until THF was refluxed. 15.37 g (58.0 mmol) of benzyl 2-bromo-2,2-difluoroacetate and 2.81 g (48.3 mmol) of propionaldehyde were added to the mixture. The mixture was then stirred for 15 minutes. After confirming disappearance of the raw materials by thin-layer chromatography (TLC), the reaction mixture was cooled to room temperature. The reaction was then terminated by adding a sodium hydrogensulfate aqueous solution.

The reaction mixture was extracted three times with ethyl acetate. The organic layer was washed once with a sodium hydrogencarbonate aqueous solution, washed once with water, washed once with a saturated sodium chloride aqueous solution, and dried over anhydrous sodium sulfate. After evaporating the solvent under reduced pressure, the product was purified by column chromatography to obtain 9.32 g of benzyl 2,2-difluoro-3-hydroxypentanoate shown by the following formula (yield: 79%).

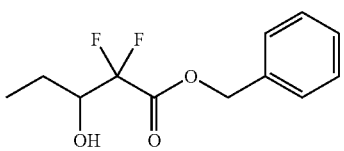 [SMILES: CCC(O)C(F)(F)C(=O)OCc1ccccc1]

50 ml of dehydrated THF, 4.63 g (45.8 mmol) of triethylamine, and 466 mg (3.82 mmol) of dimethylaminopyridine were added to 9.32 g (38.2 mmol) of benzyl 2,2-difluoro-3-hydroxypentanoate at room temperature in a nitrogen atmosphere. 4.39 g (42.0 mmol) of methacrylic chloride was added dropwise to the mixture over 10 minutes. The mixture was then stirred for 2 hours. After confirming disappearance of the raw materials by thin-layer chromatography (TLC), the reaction was terminated by adding a sodium hydrogencarbonate aqueous solution.

The reaction mixture was extracted three times with ethyl acetate. The organic layer was washed once with water, washed once with a saturated sodium chloride aqueous solution, and dried over anhydrous sodium sulfate. After evaporating the solvent under reduced pressure, the product was purified by column chromatography to obtain 6.20 g of benzyl 2,2-difluoro-3-(methacryloyloxy)pentanoate shown by the formula (M-21) (yield: 52%).

Example 55

Ethyl 2,2-difluoro-3-(methacryloyloxy)pentanoate (compound shown by the following formula (M-22)) was synthesized in accordance with Example 2 of Japanese Patent Application Publication (KOKAI) No. 2009-19199.

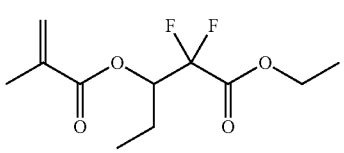
(M-22)

Example 56

4-(3,3,3-Trifluoropropanoyloxy)phenyl methacrylate (compound shown by the following formula (M-23)) was synthesized in accordance with Example 10 of Japanese Patent Application Publication (KOKAI) No. 2009-139909.

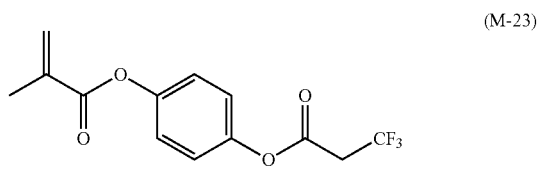 [SMILES: C=C(C)C(=O)Oc1ccc(OC(=O)CC(F)(F)F)cc1]
(M-23)

Example 57

Ethyl 2-fluoro-3-(methacryloyloxy)pentanoate (compound shown by the following formula (M-24)) was synthesized as described below.

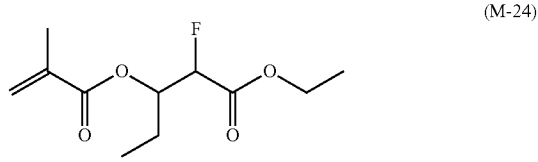 [SMILES: C=C(C)C(=O)OC(CC)C(F)C(=O)OCC]
(M-24)

The inside of a reactor (500 ml) was sufficiently dried by vacuum heating, and the atmosphere inside the reactor was replaced with dry nitrogen. The reactor was charged with 24.2 g (370 mmol/1.5 equivalents) of activated zinc and 300 ml of (dehydrated) THF. An ethyl bromofluoroacetate/THF solution (46.91 g (253.6 mmol/1.0 equivalent) of ethyl bromofluoroacetate and 80 ml of (dehydrated) THF) was added dropwise to the mixture. After the addition, the mixture was stirred at room temperature for 20 minutes. After the addition of a propionaldehyde/THF solution (14.80 g (254.8 mmol/1.0 equivalent) of propionaldehyde and 80 ml of (dehydrated) THF), the mixture was stirred at room temperature for 60 minutes.

Water and diisopropyl ether were added to the mixture to effect separation. The organic layer was washed with dilute hydrochloric acid and water, dried over magnesium sulfate, and filtered. Diisopropyl ether was then evaporated to obtain 35.4 g of ethyl 2-fluoro-3-hydroxypentanoate (intermediate). The yield was 85%.

The $^1$H-NMR data for ethyl 2-fluoro-3-hydroxypentanoate thus obtained is shown below.

$^1$H-NMR (CDCl$_3$) δ: 4.90 (dd, H; CH—F), 4.21 (q, 2H; CH$_2$—O), 3.75 (m, 1H; CH—OH), 2.45 (br, 1H; OH), 1.71 (m, 1H), 1.52 (m, 1H), 1.32 (t, 3H; CH$_3$), 1.02 (t, 3H; CH$_3$).

50 ml of dehydrated THF, 4.63 g (45.8 mmol) of triethylamine, and 466 mg (3.82 mmol) of dimethylaminopyridine were added to 6.27 g (38.2 mmol) of ethyl 2-fluoro-3-hydroxypentanoate at room temperature in a nitrogen atmosphere. 4.39 g (42.0 mmol) of methacrylic chloride was added dropwise to the mixture over 10 minutes, and the mixture was stirred for 2 hours. After confirming disappearance of the raw materials by thin-layer chromatography (TLC), the reaction was terminated by adding a sodium hydrogencarbonate aqueous solution.

The reaction mixture was extracted three times with ethyl acetate. The organic layer was washed once with water, washed once with a saturated sodium chloride aqueous solution, and dried over anhydrous sodium sulfate. After evaporating the solvent under reduced pressure, the product was purified by column chromatography to obtain 6.38 g of 2-fluoro-3-(methacryloyloxy)pentanoate (yield: 60%).

The $^1$H-NMR data for 2-fluoro-3-(methacryloyloxy)pentanoate thus obtained in the example is shown below.

$^1$H-NMR (CDCl$_3$) δ: 6.14 (s, 1H; methylene), 5.62 (s, 1H; methylene), 4.91 (dd, 1H; CH—F), 4.81 (m, 1H; CH—O), 4.27 (m, 2H; CH$_2$—O), 1.93 (s, 3H; CH$_3$), 1.80 (m, 2H; CH$_2$), 1.29 (t, 3H; CH$_3$), 0.90 (t, 3H; CH$_3$).

Example 58

3-Ethoxy-1,1,1-trifluoro-3-oxopropan-2-yl methacrylate (compound shown by the following formula (M-28)) was synthesized as described below.

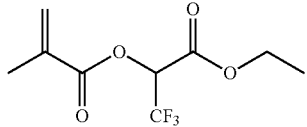
(M-28)

50 ml of dehydrated THF, 5.56 g (55.0 mmol) of triethylamine, and 305 mg (2.5 mmol) of dimethylaminopyridine were added to 7.20 g (50.0 mmol) of 3,3,3-trifluorolactic acid at room temperature in a nitrogen atmosphere. 5.75 g (55.0 mmol) of methacrylic chloride was added dropwise to the mixture over 10 minutes, and the mixture was stirred for 2 hours. After confirming disappearance of the raw materials by thin-layer chromatography (TLC), the reaction was terminated by adding a sodium hydrogencarbonate aqueous solution.

The reaction mixture was extracted three times with ethyl acetate. The organic layer was washed once with water, washed once with a saturated sodium chloride aqueous solution, and dried over anhydrous sodium sulfate. After evaporating the solvent under reduced pressure, the product was purified by column chromatography to obtain 3.71 g of 3,3,3-trifluoro-2-(methacryloyloxy)propionic acid shown by the following formula as a light yellow oil (yield: 35%).

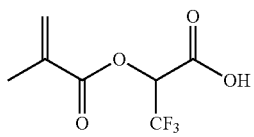

0.83 g (18 mmol) of dehydrated ethanol was added to 60 ml of a dichloromethane solution of 3.18 g (15 mmol) of 3,3,3-trifluoro-2-(methacryloyloxy)propionic acid, 6.8 g (16.5 mmol) of dicyclohexylcarbodiimide (DCC), and 0.37 g (0.003 mol) of dimethylaminopyridine (DMAP) at 0° C. in a nitrogen atmosphere. The mixture was allowed to return to room temperature, and stirred for 3 hours. After confirming disappearance of the raw materials by thin-layer chromatography (TLC), the reaction mixture was cooled to 0° C., and the reaction was terminated by adding 1N hydrochloric acid. The reaction mixture was extracted three times with ethyl acetate. The organic layer was washed twice with water. The organic layer was purified by column chromatography to obtain 2.34 g of 3-ethoxy-1,1,1-trifluoro-3-oxopropan-2-yl methacrylate (yield: 65%).

The $^1$H-NMR data for 3-ethoxy-1,1,1-trifluoro-3-oxopropan-2-yl methacrylate thus obtained in the example is shown below.

$^1$H-NMR (CDCl$_3$) δ: 1.28 (t, 3H, CH$_3$), 1.87 (s, 3H, CH$_3$—C=), 4.27 (m, 2H, CH$_2$—O), 5.50 (m, 1H, CH—CF$_3$), 5.55 (s, 1H, C=CH$_2$), 6.06 (s, 1H, C=CH$_2$).

Example 59

Methyl 2,2-difluoro-3-(methacryloyloxy)pentanoate (compound shown by the following formula (M-29)) was synthesized as described below.

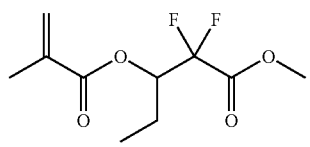 [SMILES: C=C(C)C(=O)OC(CC)C(F)(F)C(=O)OC]
(M-29)

100 g of ethyl 2,2-difluoro-3-(methacryloyloxy)pentanoate was dissolved in 1000 g of dehydrated methanol in a nitrogen atmosphere. After the addition of 0.1 g of N,N-dimethylaminopyridine (DMAP), the mixture was heated and refluxed for 5 hours. After evaporating the solvent, the residue was dissolved in 1000 g of dehydrated methanol, and the mixture was heated and refluxed for 5 hours. After evaporating the solvent, the residue was dissolved in 300 g of n-hexane. The solution was filtered through 50 g of silica gel to remove DMAP. 89.7 g of methyl 2,2-difluoro-3-(methacryloyloxy)pentanoate (M-29) was thus obtained (yield: 95%).

The $^1$H-NMR data for methyl 2,2-difluoro-3-(methacryloyloxy)pentanoate thus obtained in the example is shown below.

$^1$H-NMR (CDCl$_3$) δ: 1.00 (t, 3H, CH$_3$), 1.70-1.90 (m, 2H, CH$_2$), 1.95 (s, 3H, CH$_3$), 3.85 (s, 3H, CH$_3$—O), 5.30-5.45 (m, 1H, CH—CF$_2$), 5.65 (s, 1H, C=CH$_2$), 6.17 (s, 1H, C=CH$_2$).

(Synthesis of Polymer (A))

A polymer (A) was synthesized using the following compounds.

TABLE 1

| No. | Structure |
|---|---|
| M-1 | |
| M-2 | |
| M-3 | |
| M-4 | |
| M-5 | |
| M-6 | |
| M-7 | |
| M-8 | |
| M-9 | |

TABLE 1-continued

| No. | Structure |
|---|---|
| M-10 | (methacrylate with cyclic carbonate methyl group) |
| M-11 | 2-hydroxyethyl methacrylate |
| M-12 | hexafluoroisopropyl methacrylate |
| M-13 | 2,2,2-trifluoroethyl methacrylate |
| M-14 | tert-butyl 2,2-difluoro-3-(methacryloyloxy)pentanoate |
| M-15 | methacrylate with 4,4,4-trifluoro-3-hydroxy-3-(trifluoromethyl)butan-2-yl group |
| M-16 | 2-(trifluoroacetoxy)ethyl methacrylate |
| M-17 | methacrylate with trifluoroacetoxy-bis(trifluoromethyl) group |
| M-18 | 2-((benzyloxycarbonyl)propanoyloxy)ethyl methacrylate |
| M-19 | 2-((2-(benzyloxycarbonyl)cyclohexanecarbonyl)oxy)ethyl methacrylate |

TABLE 1-continued

| No. | Structure |
|---|---|
| M-20 | (structure) |
| M-21 | (structure) |
| M-22 | (structure) |
| M-23 | (structure) |
| M-24 | (structure) |
| M-25 | (structure) |
| M-26 | (structure) |
| M-27 | (structure) |
| M-28 | (structure) |
| M-29 | (structure) |

Synthesis Example A-1

10.40 g (0.062 mol) of the compound (M-1), 2.01 g (0.015 mol) of the compound (M-11), and 13.74 g (0.062 mol) of the compound (M-7) were dissolved in 60 g of 2-butanone, and 1.27 g of dimethyl 2,2'-azobis(2-methylpropionate) was added to the solution to prepare a monomer solution. A three-necked flask (500 ml) was charged with 3.84 g (0.015 mol) of the compound (M-5). 30 g of 2-butanone was added to the flask to dissolve the compound. The flask was purged with nitrogen for 30 minutes, and heated to 80° C. with stirring. The monomer solution prepared before was added dropwise to the flask using a dropping funnel over 3 hours. The compounds were polymerized for 6 hours from the start of addition of the monomer solution.

After completion of polymerization, the polymer solution was cooled with water to 30° C. or less, and poured into 600 g of methanol. A white powder that precipitated by this operation was filtered off. The white powder was washed with methanol in a slurry state, and filtered off This operation was repeated once. The powder was then dried at 60° C. for 15 hours to obtain a white powdery copolymer (23 g, yield: 76.7%). The copolymer had an Mw of 5500 and a Mw/Mn of 1.43. As a result of $^{13}$C-NMR analysis, it was found that the ratio of the content (mol %) of repeating units derived from the compound (M-1), the content (mol %) of repeating units derived from the compound (M-5), the content (mol %) of repeating units derived from the compound (M-11), and the content (mol %) of repeating units derived from the compound (M-7) in the copolymer was 39.8:8.6:11.1:40.5. The copolymer is referred to as "polymer (A-1)".

Synthesis Examples A-2 to A-5

Polymers (A-2) to (A-5) were synthesized in the same manner as in Synthesis Example A-1, except that the compounds shown in Table 2 were used. The property values of the polymers (A-1) to (A-5) are shown in Table 4.

TABLE 2

| | Ratio of monomers | | | | | | | |
|---|---|---|---|---|---|---|---|---|
| | Acid-labile group-containing monomer | | Lactone | | Cyclic carbonate | | Other | |
| Polymer No. (Synthesis Example No.) | No. | (mol %) | No. | (mol %) | No. | (mol %) | No. | (mol %) |
| A-1 | M-1 | 40 | M-7 | 40 | — | — | M-11 | 10 |
|     | M-5 | 10 |     |    |   |   |      |    |
| A-2 | M-2 | 20 | M-7 | 40 | — | — | — | — |
|     | M-4 | 30 |     |    |   |   |   |   |
|     | M-5 | 10 |     |    |   |   |   |   |
| A-3 | M-3 | 30 | M-7 | 40 | — | — | — | — |
|     | M-4 | 30 |     |    |   |   |   |   |
| A-4 | M-1 | 30 | M-7 | 30 | M-10 | 20 | — | — |
|     | M-4 | 10 |     |    |      |    |   |   |
|     | M-5 | 10 |     |    |      |    |   |   |
| A-5 | M-1 | 50 | M-7 | 30 | — | — | M-15 | 10 |
|     | M-5 | 10 |     |    |   |   |      |    |

(Synthesis of Polymer (C))

A polymer (C) was synthesized using the compounds shown in Table 1.

Example C-1

A three-necked flask (200 ml) was charged with a solution prepared by dissolving 5.0 g (0.022 mol) of the compound (M-16) in 10 g of 2-butanone, and 0.25 g of dimethyl 2,2'-azobis(2-methylpropionate). The flask was purged with nitrogen for 30 minutes, and heated to 80° C. with stirring. The compound was polymerized for 4 hours from the start of heating.

After completion of polymerization, the polymer solution was cooled with water to 30° C. or less. The polymer solution was concentrated under reduced pressure using an evaporator until the weight of the polymer solution was 7.5 g. The concentrate was added to a mixture of 50 g of methanol and 50 g of water. A slime-like white solid is precipitated by this operation. After removing the liquid by decantation, the slime-like white solid was washed twice with a mixture of 50 g of methanol and 50 g of water. The solid was collected, and dried at 60° C. for 15 hours under vacuum to obtain 3.1 g of a white powder (yield: 62%).

The polymer had an Mw of 7000 and a Mw/Mn of 1.48. As a result of $^{13}$C-NMR analysis, it was found that the content of repeating units derived from the compound (M-15) in the polymer was 100 mol %. The polymer is referred to as "polymer (C-1)".

Example C-2

4.01 g (0.0125 mol) of the compound (M-18) and 0.99 g (0.0042 mol) of the compound (M-12) were dissolved in 10 g of 2-butanone, and 0.14 g of dimethyl 2,2'-azobis(2-methylpropionate) was added to the solution to prepare a monomer solution. A three-necked flask (100 ml) was charged with 5 g of 2-butanone, purged with nitrogen for 30 minutes, and heated to 80° C. with stirring. The monomer solution prepared before was added dropwise to the flask using a dropping funnel over 3 hours. The compounds were polymerized for 6 hours from the start of addition of the monomer solution.

After completion of polymerization, the polymer solution was cooled with water to 30° C. or less. The polymer solution was concentrated under reduced pressure using an evaporator until the weight of the polymer solution was 30 g. The concentrate was added to a mixture of 100 g of methanol and 100 g of water. A slime-like white solid precipitated by this operation. After removing the liquid by decantation, the slime-like white solid was washed twice with 100 g of methanol. The solid was collected, and dried at 60° C. for 15 hours under vacuum to obtain 15.1 g of a white powder (yield: 76%). The resulting polymer had an Mw of 4900 and a dispersity (Mw/Mn) of 1.39. As a result of $^{13}$C-NMR analysis, it was found that the content of repeating units derived from the compound (M-18) and the content of repeating units derived from the compound (M-12) in the polymer were respectively 74.5 mol % and 25.5 mol %. The copolymer is referred to as "polymer (C-2)".

Examples C-3 to C-33

Polymers (C-3) to (C-33) were synthesized in the same manner as in Example C-2, except that the compounds shown in Table 3 were used. The property values of the polymers (C-1) to (C-33) are shown in Table 5.

TABLE 3

| Polymer No. (Example No.) | Acid-labile group-containing monomer No. | (mol %) | Lactone No. | (mol %) | Cyclic carbonate No. | (mol %) | Fluorine atom-containing monomer No. | (mol %) | No. | (mol %) | Alkali-labile group-containing monomer No. | (mol %) | No. | (mol %) | Other No. | (mol %) |
|---|---|---|---|---|---|---|---|---|---|---|---|---|---|---|---|---|
| C-1 | — | — | — | — | — | — | — | — | — | — | M-16 | 100 | — | — | — | — |
| C-2 | — | — | — | — | — | — | M-12 | 25 | — | — | M-18 | 75 | — | — | — | — |
| C-3 | — | — | — | — | — | — | M-12 | 25 | — | — | M-19 | 75 | — | — | — | — |
| C-4 | M-2 | 15 | — | — | — | — | M-12 | 25 | — | — | M-18 | 60 | — | — | — | — |
| C-5 | — | — | — | — | — | — | M-12 | 25 | — | — | M-20 | 75 | — | — | — | — |
| C-6 | — | — | — | — | — | — | M-12 | 25 | — | — | M-21 | 75 | — | — | — | — |
| C-7 | M-2 | 15 | — | — | — | — | M-12 | 25 | — | — | M-21 | 60 | — | — | — | — |
| C-8 | M-2 | 30 | — | — | — | — | M-12 | 20 | — | — | M-21 | 50 | — | — | — | — |
| C-9 | M-2 | 20 | — | — | — | — | — | — | — | — | M-22 | 80 | — | — | — | — |
| C-10 | M-2 | 50 | — | — | — | — | — | — | — | — | M-22 | 50 | — | — | — | — |
| C-11 | — | — | — | — | — | — | M-15 | 30 | — | — | M-22 | 70 | — | — | — | — |
| C-12 | — | — | — | — | — | — | M-15 | 50 | — | — | M-22 | 50 | — | — | — | — |
| C-13 | — | — | — | — | — | — | M-15 | 70 | — | — | M-22 | 30 | — | — | — | — |
| C-14 | M-2 | 70 | — | — | — | — | M-13 | 30 | — | — | — | — | — | — | — | — |
| C-15 | — | — | M-8 | 30 | — | — | M-12 | 40 | M-15 | 30 | — | — | — | — | — | — |
| C-16 | — | — | M-9 | 30 | — | — | M-12 | 40 | M-15 | 30 | — | — | — | — | — | — |
| C-17 | — | — | — | — | M-10 | 30 | M-12 | 40 | M-15 | 30 | — | — | — | — | — | — |
| C-18 | M-2 | 30 | M-8 | 30 | — | — | M-12 | 40 | — | — | — | — | — | — | — | — |
| C-19 | — | — | — | — | — | — | — | — | — | — | M-23 | 100 | — | — | — | — |
| C-20 | M-2 | 30 | — | — | — | — | — | — | — | — | M-23 | 70 | — | — | — | — |
| C-21 | — | — | — | — | — | — | — | — | — | — | M-17 | 100.0 | — | — | — | — |
| C-22 | M-3 | 10 | — | — | — | — | — | — | — | — | M-16 | 30 | M-22 | 60 | — | — |
| C-23 | M-6 | 10 | — | — | — | — | — | — | — | — | M-16 | 30 | M-22 | 60 | — | — |
| C-24 | M-5 | 10 | — | — | — | — | — | — | — | — | M-16 | 30 | M-22 | 60 | — | — |
| C-25 | M-3 | 10 | — | — | — | — | — | — | M-15 | 20 | M-22 | 70 | — | — | — | — |
| C-26 | — | — | — | — | — | — | — | — | M-11 | 10 | M-22 | 90 | — | — | — | — |
| C-27 | — | — | — | — | — | — | — | — | — | — | M-22 | 90 | — | — | M-27 | 10 |
| C-28 | — | — | — | — | — | — | — | — | M-26 | 10 | M-22 | 90 | — | — | — | — |
| C-29 | — | — | — | — | — | — | — | — | M-25 | 10 | M-22 | 90 | — | — | — | — |
| C-30 | M-3 | 10 | — | — | — | — | — | — | — | — | M-24 | 90 | — | — | — | — |
| C-31 | — | — | — | — | — | — | — | — | M-15 | 20 | M-24 | 80 | — | — | — | — |
| C-32 | M-3 | 10 | — | — | — | — | — | — | — | — | M-28 | 90 | — | — | — | — |
| C-33 | M-2 | 20 | — | — | — | — | — | — | — | — | M-29 | 80 | — | — | — | — |

TABLE 4

| Polymer No. (Synthesis Example No.) | Ratio of repeating units | | | | | | | | Evaluation of polymer | | |
|---|---|---|---|---|---|---|---|---|---|---|---|
| | Acid-labile group | | Lactone | | Cyclic carbonate | | Other | | | | Fluorine atom content |
| | No. | (mol %) | No. | (mol %) | No. | (mol %) | No. | (mol %) | Mw | Mw/Mn | (mass %) |
| A-1 | M-1 | 39.8 | M-7 | 40.5 | — | — | M-11 | 11.1 | 5500 | 1.41 | 0.00 |
| | M-5 | 8.6 | | | | | | | | | |
| A-2 | M-2 | 21.1 | M-7 | 41.6 | — | — | — | — | 5500 | 1.43 | 0.00 |
| | M-4 | 28.5 | | | | | | | | | |
| | M-5 | 8.8 | | | | | | | | | |
| A-3 | M-3 | 30.8 | M-7 | 40.1 | — | — | — | — | 5500 | 1.41 | 0.00 |
| | M-4 | 29.1 | | | | | | | | | |
| A-4 | M-1 | 30.5 | M-7 | 31.1 | M-10 | 20.1 | — | — | 6000 | 1.39 | 0.00 |
| | M-4 | 9.5 | | | | | | | | | |
| | M-5 | 8.8 | | | | | | | | | |
| A-5 | M-1 | 51.7 | M-7 | 30.8 | — | — | M-15 | 9.2 | 5500 | 1.41 | 3.56 |
| | M-5 | 8.3 | | | | | | | | | |

TABLE 5

Evaluation of polymer

| Polymer No. (Example No.) | Ratio of repeating units | | | | | | | | | | | | | | Mw | Mw/Mn | Fluorine atom content (mass %) |
|---|---|---|---|---|---|---|---|---|---|---|---|---|---|---|---|---|---|
| | Acid-labile group | | Lactone | | Cyclic carbonate | | Fluorine atom | | | | Alkali-labile group | | Other | | | | |
| | No. | (mol %) | No. | (mol %) | No. | (mol %) | No. | (mol %) | No. | (mol %) | No. | (mol %) | No. | (mol %) | | | |
| C-1 | — | — | — | — | — | — | — | — | — | — | M-16 | 100.0 | — | — | 7000 | 1.48 | 25.20 |
| C-2 | — | — | — | — | — | — | M-12 | 25.5 | — | — | M-18 | 74.5 | — | — | 5500 | 1.32 | 12.31 |
| C-3 | — | — | — | — | — | — | M-12 | 25.8 | — | — | M-19 | 74.2 | — | — | 5300 | 1.33 | 12.46 |
| C-4 | M-2 | 14.4 | — | — | — | — | M-12 | 25.5 | — | — | M-18 | 60.1 | — | — | 5100 | 1.38 | 12.31 |
| C-5 | — | — | — | — | — | — | M-12 | 26.5 | — | — | M-20 | 73.5 | — | — | 5500 | 1.32 | 12.79 |
| C-6 | — | — | — | — | — | — | M-12 | 25.5 | — | — | M-21 | 74.5 | — | — | 8300 | 1.44 | 21.38 |
| C-7 | M-2 | 17.0 | — | — | — | — | M-12 | 23.7 | — | — | M-21 | 59.3 | — | — | 8800 | 1.49 | 18.66 |
| C-8 | M-2 | 30.9 | — | — | — | — | M-12 | 19.2 | — | — | M-21 | 49.9 | — | — | 8100 | 1.41 | 15.34 |
| C-9 | M-2 | 20.1 | — | — | — | — | — | — | — | — | M-22 | 79.9 | — | — | 7900 | 1.5 | 11.32 |
| C-10 | M-2 | 50.0 | — | — | — | — | — | — | — | — | M-22 | 50.0 | — | — | 7900 | 1.55 | 7.26 |
| C-11 | — | — | — | — | — | — | M-15 | 29.5 | — | — | M-22 | 70.5 | — | — | 8200 | 1.51 | 21.66 |
| C-12 | — | — | — | — | — | — | M-15 | 48.9 | — | — | M-22 | 51.1 | — | — | 8100 | 1.51 | 26.34 |
| C-13 | — | — | — | — | — | — | M-15 | 68.8 | — | — | M-22 | 31.2 | — | — | 8200 | 1.56 | 31.48 |
| C-14 | M-2 | 69.9 | — | — | — | — | M-13 | 30.1 | — | — | — | — | — | — | 7000 | 1.41 | 10.20 |
| C-15 | — | — | M-8 | 29.3 | — | — | M-12 | 41.1 | M-15 | 29.6 | — | — | — | — | 6600 | 1.81 | 31.31 |
| C-16 | — | — | M-9 | 29.9 | — | — | M-12 | 40.9 | M-15 | 29.2 | — | — | — | — | 6900 | 1.77 | 31.06 |
| C-17 | — | — | — | — | M-10 | 29.1 | M-12 | 42.0 | M-15 | 28.9 | — | — | — | — | 7000 | 1.9 | 31.48 |
| C-18 | M-2 | 29.1 | M-8 | 29.6 | — | — | M-12 | 41.3 | — | — | — | — | — | — | 6900 | 1.88 | 19.94 |
| C-19 | — | — | — | — | — | — | — | — | — | — | M-23 | 100.0 | — | — | 6900 | 1.55 | 19.78 |
| C-20 | M-2 | 31.2 | — | — | — | — | — | — | — | — | M-23 | 68.8 | — | — | 6900 | 1.51 | 13.61 |
| C-21 | — | — | — | — | — | — | — | — | — | — | M-17 | 100.0 | — | — | 6900 | 1.67 | 43.82 |
| C-22 | M-3 | 10.4 | — | — | — | — | — | — | — | — | M-16 | 30.5 | M-22 | 59.1 | 4400 | 1.55 | 16.67 |
| C-23 | M-6 | 10.5 | — | — | — | — | — | — | — | — | M-16 | 30.5 | M-22 | 59.0 | 5300 | 1.55 | 16.67 |
| C-24 | M-5 | 9.2 | — | — | — | — | — | — | — | — | M-16 | 32.0 | M-22 | 58.8 | 4900 | 1.50 | 16.67 |
| C-25 | M-3 | 10.4 | — | — | — | — | M-15 | 19.5 | — | — | M-22 | 70.1 | — | — | 4500 | 1.49 | 18.38 |
| C-26 | — | — | — | — | — | — | M-11 | 9.9 | — | — | M-22 | 90.1 | — | — | 5000 | 1.59 | 13.67 |
| C-27 | — | — | — | — | — | — | — | — | — | — | M-22 | 90.1 | — | — | M-27 | 9.9 | 4800 | 1.41 | 13.67 |
| C-28 | — | — | — | — | — | — | M-26 | 11.0 | — | — | M-22 | 89.0 | — | — | 5500 | 1.56 | 15.21 |
| C-29 | — | — | — | — | — | — | M-25 | 9.5 | — | — | M-22 | 90.5 | — | — | 5800 | 1.48 | 16.83 |
| C-30 | M-3 | 11.9 | — | — | — | — | — | — | — | — | M-24 | 88.1 | — | — | 5500 | 1.55 | 7.21 |
| C-31 | — | — | — | — | — | — | M-15 | 20.0 | — | — | M-24 | 80.0 | — | — | 5300 | 1.49 | 14.29 |
| C-32 | M-3 | 11.2 | — | — | — | — | — | — | — | — | M-28 | 88.8 | — | — | 11000 | 2 | 9.30 |
| C-33 | M-2 | 20.2 | — | — | — | — | — | — | — | — | M-29 | 79.8 | — | — | 8900 | 1.55 | 12.80 |

(Acid Generator (B))

The acid generators (B) used in the examples and comparative examples are shown in Table 6.

TABLE 6

| No. | Structure |
|---|---|
| B-1 | Triphenylsulfonium cation with $^-O_3S\text{-}CF_2CF_2CF_2CF_3$ anion (nonafluorobutanesulfonate) |
| B-2 | (4-Cyclohexylphenyl)diphenylsulfonium cation with $^-O_3S\text{-}CF_2CF_2CF_2CF_3$ anion |

TABLE 6-continued

| No. | Structure |
| --- | --- |
| B-3 | |
| B-4 | |
| B-5 | |
| B-6 | |
| B-7 | |

(Acid Diffusion Controller (D))

The acid diffusion controllers (D) used in the examples and comparative examples are shown in Table 7.

TABLE 7

| No. | Structure |
|---|---|
| D-1 | (structure) |
| D-2 | (structure) |
| D-3 | (structure) |
| D-4 | (structure) |
| D-5 | (structure) |
| D-6 | (structure) |

(Solvent (E))

The following solvents (E) were used in the examples and comparative examples.

(E-1): propylene glycol monomethyl ether acetate (E-2): cyclohexanone

γ-Butyrolactone was used as an additive.

Example 1

100 parts of the polymer (A-1) synthesized in Synthesis Example A-1, 5 parts of the fluorine-containing polymer (C-1) synthesized in Synthesis Example C-1, 9.9 parts of the acid generator (B-1), 1.5 parts of the acid diffusion controller (D-1), 100 parts of γ-butyrolactone as additive, 1500 parts of the solvent (E-1), and 650 parts of the solvent (E-2) were mixed to prepare a radiation-sensitive resin composition solution.

Examples 2 to 47 and Comparative Examples 1 to 8

A radiation-sensitive resin composition solution was prepared in the same manner as in Example 1, except that the composition was changed as shown in Table 8. In each example and comparative example, γ-butyrolactone was used in an amount of 100 parts based on 100 parts of the polymer (A).

TABLE 8

| | Component A | | Component B | | Component C | | Component D | |
|---|---|---|---|---|---|---|---|---|
| | No. | (Parts by mass) | No. | (Parts by mass) | No. | (Parts by mass) | No. | (Parts by mass) |
| Example 1 | A-2 | 100 | B-1 | 9.9 | C-1 | 5 | D-1 | 1.5 |
| Example 2 | A-2 | 100 | B-1 | 9.9 | C-2 | 3 | D-1 | 1.5 |
| Example 3 | A-2 | 100 | B-1 | 9.9 | C-3 | 3 | D-1 | 1.5 |
| Example 4 | A-2 | 100 | B-1 | 9.9 | C-4 | 3 | D-1 | 1.5 |
| Example 5 | A-2 | 100 | B-1 | 9.9 | C-6 | 3 | D-1 | 1.5 |
| Example 6 | A-2 | 100 | B-1 | 9.9 | C-7 | 1 | D-1 | 1.5 |
| Example 7 | A-2 | 100 | B-1 | 9.9 | C-7 | 3 | D-1 | 1.5 |
| Example 8 | A-2 | 100 | B-1 | 9.9 | C-7 | 5 | D-1 | 1.5 |
| Example 9 | A-2 | 100 | B-1 | 9.9 | C-7 | 2 | D-1 | 1.5 |
| Example 10 | A-2 | 100 | B-2 | 11.4 | C-7 | 2 | D-1 | 1.5 |
| Example 11 | A-2 | 100 | B-3 | 9.5 | C-7 | 2 | D-1 | 1.5 |
| Example 12 | A-3 | 100 | B-2 | 11.4 | C-7 | 2 | D-1 | 1.5 |
| Example 13 | A-4 | 100 | B-2 | 11.4 | C-7 | 3 | D-1 | 1.5 |
| Example 14 | A-2 | 100 | B-1 | 9.9 | C-8 | 3 | D-1 | 1.5 |
| Example 15 | A-2 | 100 | B-1 | 9.9 | C-5 | 3 | D-1 | 1.5 |
| Example 16 | A-4 | 100 | B-2 | 11.4 | C-9 | 3 | D-1 | 1.5 |

TABLE 8-continued

|  | Component A | | Component B | | Component C | | Component D | |
| --- | --- | --- | --- | --- | --- | --- | --- | --- |
|  | No. | (Parts by mass) | No. | (Parts by mass) | No. | (Parts by mass) | No. | (Parts by mass) |
| Example 17 | A-4 | 100 | B-2 | 11.4 | C-10 | 3 | D-1 | 1.5 |
| Example 18 | A-4 | 100 | B-2 | 11.4 | C-11 | 3 | D-1 | 1.5 |
| Example 19 | A-4 | 100 | B-2 | 11.4 | C-12 | 3 | D-1 | 1.5 |
| Example 20 | A-4 | 100 | B-2 | 11.4 | C-13 | 3 | D-1 | 1.5 |
| Example 21 | A-4 | 100 | B-2 | 11.4 | C-21 | 5 | D-1 | 1.5 |
| Example 22 | A-4 | 100 | B-2 | 11.4 | C-22 | 5 | D-1 | 1.5 |
| Example 23 | A-4 | 100 | B-2 | 11.4 | C-23 | 5 | D-1 | 1.5 |
| Example 24 | A-4 | 100 | B-2 | 11.4 | C-24 | 5 | D-1 | 1.5 |
| Example 25 | A-4 | 100 | B-2 | 11.4 | C-25 | 5 | D-1 | 1.5 |
| Example 26 | A-4 | 100 | B-2 | 11.4 | C-26 | 5 | D-1 | 1.5 |
| Example 27 | A-4 | 100 | B-2 | 11.4 | C-27 | 5 | D-1 | 1.5 |
| Example 28 | A-4 | 100 | B-2 | 11.4 | C-28 | 5 | D-1 | 1.5 |
| Example 29 | A-4 | 100 | B-2 | 11.4 | C-29 | 5 | D-1 | 1.5 |
| Example 30 | A-4 | 100 | B-2 | 11.4 | C-30 | 5 | D-1 | 1.5 |
| Example 31 | A-4 | 100 | B-2 | 11.4 | C-31 | 5 | D-1 | 1.5 |
| Example 32 | A-4 | 100 | B-1 | 9.9 | C-9 | 5 | D-1 | 1.5 |
| Example 33 | A-4 | 100 | B-2 | 11.4 | C-9 | 5 | D-1 | 1.5 |
| Example 34 | A-4 | 100 | B-3 | 9.5 | C-9 | 5 | D-1 | 1.5 |
| Example 35 | A-4 | 100 | B-4 | 9 | C-9 | 5 | D-1 | 1.5 |
| Example 36 | A-4 | 100 | B-5 | 10 | C-9 | 5 | D-1 | 1.5 |
| Example 37 | A-4 | 100 | B-6 | 12 | C-9 | 5 | D-1 | 1.5 |
| Example 38 | A-4 | 100 | B-7 | 10.3 | C-9 | 5 | D-1 | 1.5 |
| Example 39 | A-4 | 100 | B-1 | 7.0 | C-9 | 5 | D-1 | 1.5 |
|  |  |  | B-7 | 5.0 |  |  |  |  |
| Example 40 | A-4 | 100 | B-1 | 9.9 | C-9 | 5 | D-2 | 1.5 |
| Example 41 | A-4 | 100 | B-1 | 9.9 | C-9 | 5 | D-3 | 1.5 |
| Example 42 | A-4 | 100 | B-1 | 9.9 | C-9 | 5 | D-4 | 1.5 |
| Example 43 | A-4 | 100 | B-1 | 9.9 | C-9 | 5 | D-5 | 1.5 |
| Example 44 | A-4 | 100 | B-1 | 9.9 | C-9 | 5 | D-6 | 1.5 |
| Example 45 | A-4 | 100 | B-2 | 11.4 | C-32 | 5 | D-1 | 1.5 |
| Example 46 | A-5 | 100 | B-2 | 11.4 | C-9 | 5 | D-1 | 1.5 |
| Example 47 | A-5 | 100 | B-2 | 11.4 | C-33 | 5 | D-1 | 1.5 |
| Comparative Example 1 | A-2 | 100 | B-1 | 9.9 | C-14 | 3 | D-1 | 1.5 |
| Comparative Example 2 | A-2 | 100 | B-1 | 9.9 | C-15 | 5 | D-1 | 1.5 |
| Comparative Example 3 | A-2 | 100 | B-1 | 9.9 | C-16 | 5 | D-1 | 1.5 |
| Comparative Example 4 | A-2 | 100 | B-1 | 9.9 | C-17 | 5 | D-1 | 1.5 |
| Comparative Example 5 | A-2 | 100 | B-1 | 9.9 | C-18 | 5 | D-1 | 1.5 |
| Comparative Example 6 | A-2 | 100 | B-1 | 9.9 | C-19 | 5 | D-1 | 1.5 |
| Comparative Example 7 | A-2 | 100 | B-1 | 9.9 | C-20 | 5 | D-1 | 1.5 |
| Comparative Example 8 | A-4 | 100 | B-1 | 9.9 | — | — | D-1 | 1.5 |

The evaluation results are shown in Table 9.

TABLE 9

|  | Receding contact angle | | | | | |
| --- | --- | --- | --- | --- | --- | --- |
|  | After SB (°) | After development (°) | Δ (°) | Development defects | Pattern shape | MEEF |
| Example 1 | 70 | 48 | 22 | Fair | Acceptable | Fair |
| Example 2 | 76 | 49 | 27 | Fair | T-top | Fair |
| Example 3 | 78 | 51 | 27 | Fair | T-top | Fair |
| Example 4 | 78 | 49 | 29 | Fair | Acceptable | Fair |
| Example 5 | 76 | 41 | 35 | Fair | T-top | Acceptable |
| Example 6 | 74 | 49 | 25 | Acceptable | Acceptable | Fair |
| Example 7 | 78 | 42 | 36 | Acceptable | Acceptable | Fair |
| Example 8 | 80 | 42 | 38 | Acceptable | Acceptable | Fair |
| Example 9 | 80 | 44 | 36 | Acceptable | Acceptable | Fair |
| Example 10 | 80 | 44 | 36 | Acceptable | Acceptable | Acceptable |
| Example 11 | 80 | 44 | 36 | Acceptable | Acceptable | Acceptable |
| Example 12 | 80 | 42 | 38 | Acceptable | Acceptable | Fair |
| Example 13 | 80 | 45 | 35 | Acceptable | Acceptable | Acceptable |
| Example 14 | 80 | 44 | 36 | Acceptable | Acceptable | Fair |
| Example 15 | 76 | 42 | 34 | Fair | Acceptable | Acceptable |

TABLE 9-continued

|  | Receding contact angle | | | | | |
|---|---|---|---|---|---|---|
|  | After SB (°) | After development (°) | Δ (°) | Development defects | Pattern shape | MEEF |
| Example 16 | 80 | 45 | 35 | Acceptable | Acceptable | Fair |
| Example 17 | 80 | 45 | 35 | Acceptable | Acceptable | Fair |
| Example 18 | 78 | 45 | 33 | Acceptable | Acceptable | Acceptable |
| Example 19 | 77 | 47 | 30 | Fair | Acceptable | Acceptable |
| Example 20 | 72 | 49 | 23 | Fair | Top round | Acceptable |
| Example 21 | 81 | 55 | 26 | Fair | Acceptable | Acceptable |
| Example 22 | 73 | 39 | 34 | Acceptable | Acceptable | Acceptable |
| Example 23 | 72 | 38 | 34 | Acceptable | Acceptable | Acceptable |
| Example 24 | 72 | 38 | 34 | Acceptable | Acceptable | Acceptable |
| Example 25 | 75 | 42 | 33 | Acceptable | Acceptable | Acceptable |
| Example 26 | 73 | 39 | 34 | Acceptable | Acceptable | Acceptable |
| Example 27 | 73 | 42 | 31 | Acceptable | Acceptable | Acceptable |
| Example 28 | 73 | 35 | 38 | Acceptable | Acceptable | Acceptable |
| Example 29 | 73 | 42 | 31 | Acceptable | Acceptable | Acceptable |
| Example 30 | 75 | 39 | 36 | Acceptable | Acceptable | Acceptable |
| Example 31 | 76 | 40 | 36 | Acceptable | Acceptable | Acceptable |
| Example 32 | 80 | 44 | 36 | Acceptable | Acceptable | Fair |
| Example 33 | 80 | 44 | 36 | Acceptable | Acceptable | Acceptable |
| Example 34 | 80 | 44 | 36 | Acceptable | Acceptable | Acceptable |
| Example 35 | 80 | 44 | 36 | Fair | Acceptable | Acceptable |
| Example 36 | 80 | 44 | 36 | Fair | Acceptable | Acceptable |
| Example 37 | 81 | 43 | 38 | Fair | Acceptable | Acceptable |
| Example 38 | 81 | 43 | 38 | Acceptable | T-top | Acceptable |
| Example 39 | 80 | 43 | 37 | Acceptable | Acceptable | Acceptable |
| Example 40 | 80 | 44 | 36 | Acceptable | Acceptable | Acceptable |
| Example 41 | 78 | 43 | 35 | Fair | T-top | Acceptable |
| Example 42 | 77 | 45 | 32 | Fair | Acceptable | Acceptable |
| Example 43 | 77 | 43 | 34 | Fair | Acceptable | Acceptable |
| Example 44 | 75 | 44 | 31 | Fair | Acceptable | Acceptable |
| Example 45 | 83 | 39 | 44 | Acceptable | Acceptable | Acceptable |
| Example 46 | 78 | 40 | 38 | Acceptable | Acceptable | Acceptable |
| Example 47 | 78 | 35 | 43 | Acceptable | Acceptable | Acceptable |
| Comparative Example 1 | 78 | 77 | 1 | Unacceptable | Acceptable | Unacceptable |
| Comparative Example 2 | 65 | 59 | 6 | Unacceptable | Top round | Acceptable |
| Comparative Example 3 | 70 | 60 | 10 | Unacceptable | Tpo round | Acceptable |
| Comparative Example 4 | 64 | 58 | 6 | Unacceptable | Top round | Acceptable |
| Comparative Example 5 | 70 | 61 | 9 | Unacceptable | Acceptable | Fair |
| Comparative Example 6 | 76 | 55 | 21 | Fair | Scum | Acceptable |
| Comparative Example 7 | 75 | 59 | 16 | Fair | Scum | Fair |
| Comparative Example 8 | 57 | 46 | 11 | — | — | — |

As is clear from the results shown in Table 9, it was confirmed that the resist films formed using the resist compositions of Examples 1 to 47 including the polymer (C) had a high receding contact angle with water after SB as compared with the resist film formed using the resist composition of Comparative Example 8 that did not include the polymer (C). This suggests that the hydrophobicity of the resist film increased due to the fluorine-containing polymer. It is thus expected that the scan followability and a reduction in elution during liquid immersion scan lithography are improved.

As is clear from the results shown in Table 9, it was confirmed that the receding contact angle with water of the resist films formed using the resist compositions of Examples 1 to 47 after development was lower than the receding contact angle with water before development. This suggests that the fluorine-containing polymer ensured that the hydrophilicity of the resist film is increased due to alkali development. It is thus expected that the developer and the rinse agent are spread in an improved manner, and the effect of suppressing defects due to liquid immersion lithography is improved.

It was also confirmed that the resist films formed using the resist compositions of Examples 1 to 47 produced scum to only a small extent as compared with the resist films formed using the resist compositions of Comparative Examples 6 and 7.

The resist films formed using the resist compositions of Examples 1 to 47 exhibited high hydrophobicity during liquid immersion lithography, exhibited improved hydrophilicity after alkali development, and suppressed occurrence of scum in the resist pattern obtained by development.

The radiation-sensitive resin composition according to the embodiment of the invention may suitably be used as a chemically-amplified resist for producing semiconductor devices (particularly a resist for liquid immersion lithography).

Obviously, numerous modifications and variations of the present invention are possible in light of the above teachings. It is therefore to be understood that within the scope of the appended claims, the invention may be practiced otherwise than as specifically described herein.

The invention claimed is:

1. A radiation-sensitive resin composition comprising:
a first polymer comprising an acid-labile group;
an acid generator to generate an acid upon exposure to radiation; and
a second polymer comprising a fluorine atom and a repeating unit shown by formula (c2-1),
the second polymer having a fluorine atom content higher than a fluorine atom content of the first polymer, and being in an amount of 0.1 to 20 parts by mass based on 100 parts by mass of the first polymer,

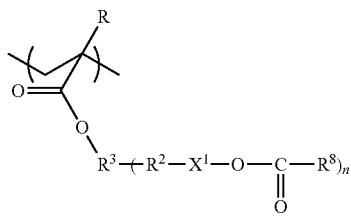

(c2-1)

wherein
n is an integer from 1 to 3,
$X^1$ represents a single bond, a difluoromethylene group, or a linear or branched perfluoroalkylene group having 2 to 20 carbon atoms,
$R^2$ represents a single bond, a divalent chain hydrocarbon group having 1 to 10 carbon atoms, or a divalent cyclic hydrocarbon group having 4 to 20 carbon atoms, wherein each $R^2$ is a same as or different from each other when n is 2 or 3,
$R^3$ represents an (n+1)-valent hydrocarbon group having 1 to 20 carbon atoms, wherein, optionally, an oxygen atom, a sulfur atom, an imino group, a carbonyl group, —CO—O—, or —CO—NH— is bonded to an end of $R^3$ which is bonded to $R^2$,
R represents a hydrogen atom, a methyl group, or a trifluoromethyl group,
$R^8$ represents a fluorine-substituted hydrocarbon group having 1 to 10 carbon atoms in which at least one hydrogen atom is substituted with a fluorine atom, wherein each $R^8$ is a same as or different from each other when n is 2 or 3, and
$R^8$ and the CO group bonded to $R^8$ taken together are an alkali-labile group, wherein the alkali-labile group is a group that is separable to form a polar functional group in a presence of an alkali.

2. The radiation-sensitive resin composition according to claim 1, wherein the second polymer further comprises a repeating unit shown by formula (c3) or a repeating unit shown by formula (c4),

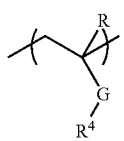

(c3)

wherein
R is a same as defined for the formula (c2-1),
G represents a single bond, an oxygen atom, a sulfur atom, —CO—O—, —SO$_2$—O—NH—, —CO—NH—, or —O—CO—NH—, and
$R^4$ represents a fluorine-substituted chain hydrocarbon group having 1 to 6 carbon atoms in which at least one hydrogen atom is substituted with a fluorine atom, or a fluorine-substituted cyclic hydrocarbon group having 4 to 20 carbon atoms in which at least one hydrogen atom is substituted with a fluorine atom, and

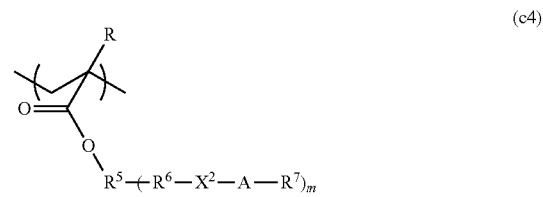

(c4)

wherein
m is an integer from 1 to 3,
R is a same as defined for the formula (c2-1),
A represents an oxygen atom or —CO—O—#, wherein the oxygen atom represented by A is not bonded directly to an aromatic ring, a carbonyl group which is not included in $R^7$, or a sulfoxyl group, "#" indicates a bonding hand bonded to $R^7$, and each A is either a same as or different from each other when m is 2 or 3,
$R^7$ represents a hydrogen atom or an acid-labile group, wherein each $R^7$ is either a same as or different from each other when m is 2 or 3,
$R^6$ is a same as defined for $R^2$ in the formula (c2-1), wherein each $R^6$ is either a same as or different from each other when m is 2 or 3,
$R^5$ is a same as defined for $R^3$ in the formula (c2-1), and
$X^2$ is a same as defined for $X^1$ in the formula (c2-1), wherein each $X^2$ is either a same as or different from each other when m is 2 or 3.

3. A method for forming a resist pattern comprising:
applying the radiation-sensitive resin composition according to claim 1 on a substrate to provide a resist film on the substrate;
exposing the resist film by applying radiation to the resist film via a mask pattern; and
developing the exposed resist film to form a resist pattern.

4. The method according to claim 3, wherein the resin film is exposed via an immersion liquid provided over the resist film.

5. The radiation-sensitive resin composition according to claim 1, wherein the second polymer has the fluorine content higher than the fluorine content of the first polymer by 1 mass % or more.

6. The radiation-sensitive resin composition according to claim 1, wherein the second polymer has the fluorine content higher than the fluorine content of the first polymer by 5 mass % or more.

7. A radiation-sensitive resin composition comprising:
a first polymer comprising an acid-labile group;
an acid generator to generate an acid upon exposure to radiation; and
a second polymer comprising a fluorine atom and a repeating unit shown by formula (c2-2),
the second polymer having a fluorine atom content higher than a fluorine atom content of the first polymer, and being in an amount of 0.1 to 20 parts by mass based on 100 parts by mass of the first polymer,

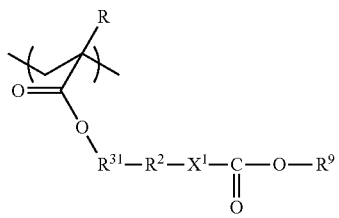
(c2-2)

wherein
$X^1$ represents a single bond, a difluoromethylene group, or a linear or branched perfluoroalkylene group having 2 to 20 carbon atoms, $R^2$ represents a single bond, a divalent chain hydrocarbon group having 1 to 10 carbon atoms, or a divalent cyclic hydrocarbon group having 4 to 20 carbon atoms, $R^{31}$ represents a divalent chain hydrocarbon group having 1 to 10 carbon atoms or a divalent cyclic hydrocarbon group having 4 to 20 carbon atoms, wherein, optionally, an oxygen atom, a sulfur atom, an imino group, a carbonyl group, —CO—O—, or —CO—NH— is bonded to an end of $R^{31}$ which is bonded to $R^2$, R represents a hydrogen atom, a methyl group, or a trifluoromethyl group, and $R^9$ is an alkali-labile group and represents a group shown by formula (1), formula (2) or formula (3), wherein the alkali-labile group is a group that is separable to form a polar functional group in a presence of an alkali,

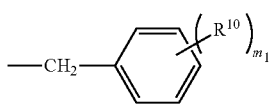
(1)

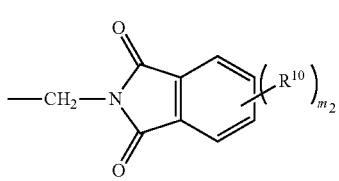
(2)

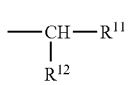
(3)

wherein $R^{10}$ represents a halogen atom, an alkyl group having 1 to 10 carbon atoms, an alkoxy group having 1 to 10 carbon atoms, an acyl group having 1 to 10 carbon atoms, or an acyloxy group having 1 to 10 carbon atoms, wherein each $R^{10}$ is either a same as or different from each other when a plurality of $R^{10}$ are present, $m_1$ is an integer from 0 to 5, $m_2$ is an integer from 0 to 4, and each of $R^{11}$ and $R^{12}$ independently represents a hydrogen atom or an alkyl group having 1 to 10 carbon atoms, or $R^{11}$ and $R^{12}$ bond to each other to form an alicyclic hydrocarbon group having 4 to 20 carbon atoms together with the carbon atom bonded to $R^{11}$ and $R^{12}$.

8. The radiation-sensitive resin composition according to claim 7, wherein the second polymer further comprises a repeating unit shown by formula (c3) or a repeating unit shown by formula (c4),

(c3)

wherein
R is a same as defined for the formula (c2-2),

G represents a single bond, an oxygen atom, a sulfur atom, —CO—O—, —SO$_2$—O—NH—, —CO—NH—, or —O—CO—NH—, and $R^4$ represents a fluorine-substituted chain hydrocarbon group having 1 to 6 carbon atoms in which at least one hydrogen atom is substituted with a fluorine atom, or a fluorine-substituted cyclic hydrocarbon group having 4 to 20 carbon atoms in which at least one hydrogen atom is substituted with a fluorine atom, and

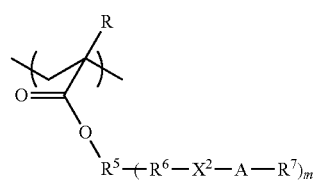
(c4)

wherein
m is an integer from 1 to 3,

R is a same as defined for the formula (c2-2),

A represents an oxygen atom or —CO—O—#, wherein the oxygen atom represented by A is not bonded directly to an aromatic ring, a carbonyl group which is not included in $R^7$, or a sulfoxyl group, "#" indicates a bonding hand bonded to $R^7$, and each A is either a same as or different from each other when m is 2 or 3, $R^7$ represents a hydrogen atom or an acid-labile group, wherein each $R^7$ is either a same as or different from each other when m is 2 or 3, $R^6$ is a same as defined for $R^2$ in the formula (c2-2), wherein each $R^6$ is either a same as or different from each other when m is 2 or 3, $R^5$ represents an (n+1)-valent hydrocarbon group having 1 to 20 carbon atoms, wherein, optionally, an oxygen atom, a sulfur atom, an imino group, a carbonyl group, —CO—O—, or —CO—NH— is bonded to an end of $R^3$ which is bonded to $R^2$, and $X^2$ is a same as defined for $X^1$ in the formula (c2-2), wherein each $X^2$ is either a same as or different from each other when m is 2 or 3.

9. A method for forming a resist pattern comprising:

applying the radiation-sensitive resin composition according to claim 7 on a substrate to provide a resist film on the substrate;

exposing the resist film by applying radiation to the resist film via a mask pattern; and developing the exposed resist film to form a resist pattern.

10. The method according to claim 9, wherein the resin film is exposed via an immersion liquid provided over the resist film.

11. The radiation-sensitive resin composition according to claim 7, wherein the second polymer has the fluorine content higher than the fluorine content of the first polymer by 1 mass % or more.

12. The radiation-sensitive resin composition according to claim 7, wherein the second polymer has the fluorine content higher than the fluorine content of the first polymer by 5 mass % or more.

* * * * *